(12) United States Patent
Yoon et al.

(10) Patent No.: US 10,763,397 B2
(45) Date of Patent: Sep. 1, 2020

(54) SEMICONDUCTOR LIGHT EMITTING DEVICE

(71) Applicant: SAMSUNG ELECTRONICS CO., LTD., Suwon-si, Gyeonggi-do (KR)

(72) Inventors: JuHeon Yoon, Seoul (KR); Jung Hwan Kil, Suwon-si (KR); Tae Hun Kim, Bucheon-si (KR); Hwa Ryong Song, Osan-si (KR); Jae In Sim, Yongin-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/202,793

(22) Filed: Nov. 28, 2018

(65) Prior Publication Data
US 2019/0273185 A1    Sep. 5, 2019

(30) Foreign Application Priority Data

Mar. 2, 2018    (KR) ................... 10-2018-0025090

(51) Int. Cl.
| | |
|---|---|
| *H01L 33/40* | (2010.01) |
| *H01L 33/06* | (2010.01) |
| *H01L 33/12* | (2010.01) |
| *H01L 33/22* | (2010.01) |
| *H01L 33/46* | (2010.01) |
| *H01L 33/50* | (2010.01) |
| *H01L 33/60* | (2010.01) |
| *H01L 33/62* | (2010.01) |
| *H01L 33/42* | (2010.01) |

(52) U.S. Cl.
CPC ............ *H01L 33/405* (2013.01); *H01L 33/06* (2013.01); *H01L 33/12* (2013.01); *H01L 33/22* (2013.01); *H01L 33/42* (2013.01); *H01L 33/46* (2013.01); *H01L 33/502* (2013.01); *H01L 33/60* (2013.01); *H01L 33/62* (2013.01); *H01L 2933/0016* (2013.01)

(58) Field of Classification Search
CPC ..... H01L 51/56; H01L 51/0072; H01L 43/02; H01L 51/5056; H01L 43/10
USPC ........................................................ 257/13
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |

(Continued)

*Primary Examiner* — Andy Huynh
(74) *Attorney, Agent, or Firm* — Lee IP Law, P.C.

(57) ABSTRACT

A semiconductor light emitting device includes a light emitting structure having a first conductivity-type semiconductor layer, an active layer and a second conductivity-type semiconductor layer, a transparent electrode layer on the second conductivity-type semiconductor layer and spaced apart from an edge of the second conductivity-type semiconductor layer, a first insulating layer on the light emitting structure to cover the transparent electrode layer and including a plurality of holes connected to the transparent electrode layer, and a reflective electrode layer on the first insulating layer and connected to the transparent electrode layer through the plurality of holes.

19 Claims, 21 Drawing Sheets

(56) References Cited

U.S. PATENT DOCUMENTS

| | | |
|---|---|---|
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,615,794 B2 | 11/2009 | Katsuno et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,637,886 B2 | 1/2014 | Tsuji |
| 8,735,931 B2 | 5/2014 | Han et al. |
| 8,766,295 B2 | 7/2014 | Kim |
| 8,884,329 B2 | 11/2014 | Okabe et al. |
| 9,178,116 B2 | 11/2015 | Hodota |
| 9,853,189 B2 | 12/2017 | Song et al. |
| 2012/0241803 A1* | 9/2012 | Kinugawa ............... H01L 33/42 257/99 |
| 2014/0131731 A1* | 5/2014 | Kim ........................ H01L 33/32 257/76 |
| 2014/0183590 A1 | 7/2014 | Kim et al. |
| 2014/0312369 A1* | 10/2014 | Yoon ..................... H01L 33/382 257/96 |
| 2015/0171298 A1* | 6/2015 | Cho ....................... H01L 33/38 257/98 |
| 2016/0149086 A1* | 5/2016 | Sim ........................ H01L 33/46 257/98 |
| 2017/0141260 A1 | 5/2017 | Chen et al. |
| 2018/0226771 A1* | 8/2018 | Tazawa ............... H01S 5/18311 |
| 2019/0296204 A1* | 9/2019 | Oh ......................... H01L 33/10 |

* cited by examiner

SEMICONDUCTOR LIGHT EMITTING DEVICE

CROSS-REFERENCE TO RELATED APPLICATION

Korean Patent Application No. 10-2018-0025090, filed on Mar. 2, 2018, in the Korean Intellectual Property Office, and entitled: "Semiconductor Light Emitting Device," is incorporated by reference herein in its entirety.

BACKGROUND

1. Field

The present disclosure relates to a semiconductor light emitting device.

2. Description of the Related Art

Semiconductor light emitting devices are known as next generation light sources having many positive attributes, e.g., relatively long lifespans, low degrees of power consumption, rapid response rates, environmentally friendly characteristics, and the like, as compared to light sources according to the related art. Semiconductor light emitting devices have been used as important light sources in various products, e.g., lighting devices, the backlight units of display devices, and the like.

SUMMARY

According to an aspect of embodiments, a semiconductor light emitting device includes a light emitting structure including a first conductivity-type semiconductor layer, an active layer and a second conductivity-type semiconductor layer, a transparent electrode layer disposed on the second conductivity-type semiconductor layer and spaced apart from an edge of the second conductivity-type semiconductor layer, a first insulating layer disposed on the light emitting structure to cover the transparent electrode layer and including a plurality of holes connected to the transparent electrode layer, and a reflective electrode layer disposed on the first insulating layer and connected to the transparent electrode layer through the plurality of holes.

According to embodiments, a semiconductor light emitting device includes a light emitting structure including a first conductivity-type semiconductor layer, an active layer and a second conductivity-type semiconductor layer, a transparent electrode layer disposed on the second conductivity-type semiconductor layer, a first insulating layer disposed on the light emitting structure to cover the transparent electrode layer, and including a plurality of holes connected to the transparent electrode layer, and a reflective electrode layer disposed on the first insulating layer and connected to the transparent electrode layer through the plurality of holes, a second insulating layer disposed on the first insulating layer to cover the reflective electrode layer, and including at least one opening, and a connection electrode disposed on the second insulating layer and connected to the reflective electrode layer through the at least one opening. The connection electrode includes a first electrode layer including an edge region and an internal region surrounded by the edge region, and a second electrode layer disposed in the internal region of the first electrode layer, and the edge region has a thickness less than a thickness of the internal region.

According to embodiments, a semiconductor light emitting device includes a light emitting structure including a first conductivity-type semiconductor layer, an active layer and a second conductivity-type semiconductor layer, and an electrode structure disposed on an upper surface of the second conductivity-type semiconductor layer. The electrode structure includes a first electrode layer having an edge region and an internal region surrounded by the edge region, and a second electrode layer disposed in the internal region of the first electrode layer, and the edge region has a thickness less than a thickness of the internal region.

BRIEF DESCRIPTION OF THE DRAWINGS

Features will become apparent to those of skill in the art by describing in detail exemplary embodiments with reference to the attached drawings, in which.

DETAILED DESCRIPTION

Hereinafter, detailed example embodiments will be described with reference to the accompanying drawings.

Figure 1:
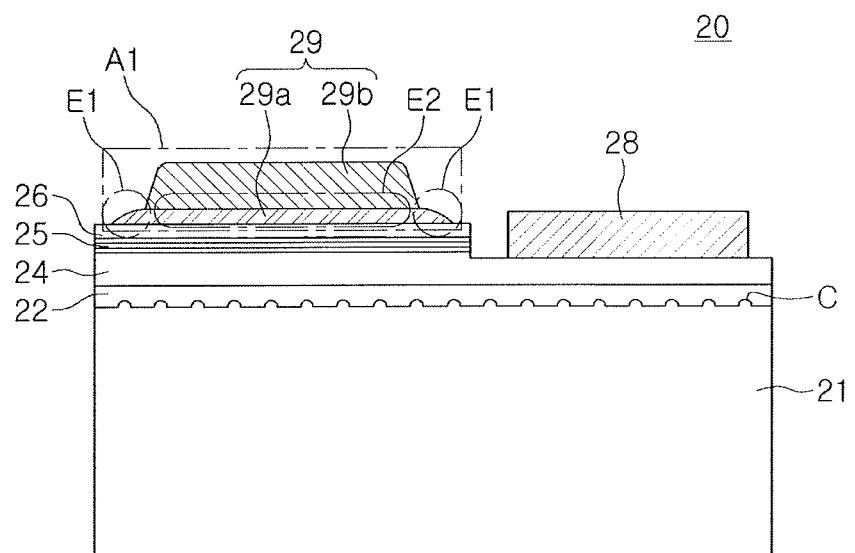
FIG. 1 illustrates a schematic side cross-sectional view of a semiconductor light emitting device according to an example embodiment.

FIG. 1 is a schematic side cross-sectional view of a semiconductor light emitting device according to an example embodiment.

Referring to FIG. 1, a semiconductor light emitting device 20, i.e., a semiconductor light emitting diode chip 20, according to an example embodiment may include a substrate 21, a first conductivity-type semiconductor layer 24, an active layer 25, and a second conductivity-type semiconductor layer 26, sequentially stacked on the substrate 21 along stacking direction. A buffer layer 22 may be disposed between the substrate 21 and the first conductivity-type semiconductor layer 24.

The substrate 21 may be an insulating substrate, e.g., a sapphire substrate, but is not limited thereto. The substrate 21 may be a conductive substrate or a semiconductor substrate in addition to the insulating substrate. For example, the substrate 21 may be formed of SiC, Si, $MgAl_2O_4$, MgO, $LiAlO_2$, $LiGaO_2$, or GaN, in addition to sapphire. A concavo-convex portion C may be formed on an upper surface of the substrate 21. The concavo-convex portion C may improve the quality of grown monocrystalline while improving light extraction efficiency.

The buffer layer 22 may be a layer of $In_xAl_yGa_{1-x-y}N$ ($0 \le x \le 1$, $0 \le y \le 1$). For example, the buffer layer 22 may be a GaN layer, an AlN layer, an AlGaN layer, or an InGaN layer. Further, the buffer layer 22 may also be used by combining a plurality of layers or gradually changing a composition thereof, as required.

The first conductivity-type semiconductor layer 24 may be a nitride semiconductor satisfying n-type $In_xAl_yGa_{1-x-y}N$ ($0 \le x < 1$, $0 \le y < 1$, $0 \le x+y < 1$), and an n-type impurity thereof may be Si. For example, the first conductivity-type semiconductor layer 24 may include n-type GaN. The second conductivity-type semiconductor layer 26 may be a nitride semiconductor layer satisfying p-type $In_xAl_yGa_{1-x-y}N$ ($0 \le x < 1$, $0 \le y < 1$, $0 \le x+y < 1$), and a p-type impurity thereof may be Mg. For example, although the second conductivity-type semiconductor layer 26 may be implemented as a single-layer structure, the second conductivity-type semiconductor layer 26 may also have a multilayer structure having different compositions.

The active layer 25 may have a multiple quantum well (MQW) structure, in which a quantum well layer and a quantum barrier layer are alternately stacked. For example, the quantum well layer and the quantum barrier layer may be layers of $In_xAl_yGa_{1-x-y}N$ ($0 \le x \le 1$, $0 \le y \le 1$, $0 \le x+y \le 1$) having different compositions. In a specific example, the quantum well layer may be a layer of $In_xGa_{1-x}N$ ($0 < x \le 1$), and the quantum barrier layer may a GaN layer or an AlGaN layer. Thicknesses of the quantum well layer and the quantum barrier layer may respectively be within a range of about 1 nm to about 50 nm. The active layer 25 is not limited to having a multiple quantum well structure, and may have a single quantum well structure.

First and second electrode structures 28 and 29 may be disposed in a mesaetched region of the first conductivity-type semiconductor layer 24 and on the second conductivity-type semiconductor layer 26, respectively, such that the first and second electrode structures 28 and 29 may be located on a same surface, e.g., on a first surface. For example, as illustrated in FIG. 1, the first and second electrode structures 28 and 29 may be both on a surface of the buffer layer 22 that faces away from the substrate 21.

The first electrode structure 28 may include at least one of, e.g., aluminum (Al), gold (Au), chromium (Cr), nickel (Ni), titanium (Ti), and tin (Sn), and may be formed of a single layer or a plurality of layers. The first electrode structure 28 may be directly on the mesa-etched region of the first conductivity-type semiconductor layer 24.

The second electrode structure 29 may include at least a first electrode layer 29a and a second electrode layer 29b, e.g., the first electrode layer 29a may be between the second conductivity-type semiconductor layer 26 and the second electrode layer 29b. The second electrode layer 29b may have a thickness along the stacking direction greater than that of the first electrode layer 29a.

In detail, the first electrode layer 29a may have an edge region E1 and an internal region E2 surrounded by the edge region E1, and the second electrode layer 29b may be disposed on the internal region E2 of the first electrode layer 29a. In addition, the edge region E1 of the first electrode layer 29a may have a thickness less than that of the internal region E2. In the example embodiment, the edge region E1 of the first electrode layer 29a may have a thickness reduced externally, e.g., a thickness of the edge region E1 of the first electrode layer 29a may be gradually reduced as a distance from the internal region E2 increases.

The first electrode layer 29a may be provided as a reflective electrode, and may be used as an electrode for spreading of current. For example, the first electrode layer 29a may include at least one of silver (Ag), chromium (Cr), nickel (Ni), titanium (Ti), aluminum (Al), rhodium (Rh), ruthenium (Ru), palladium (Pd), gold (Au), copper (Cu), and combinations thereof, and the second electrode layer 29b may include at least one of Au and Cu. Each of the first electrode layer 29a and the second electrode layer 29b may include layers having different materials.

The second electrode structure 29 employed in the example embodiment may be obtained by depositing the first electrode layer 29a and the second electrode layer 29b using different processes, while using a single photoresist pattern. Formation of the second electrode structure 29 will be described in more detail below with reference to FIGS. 2A-2C.

Figure 2A:
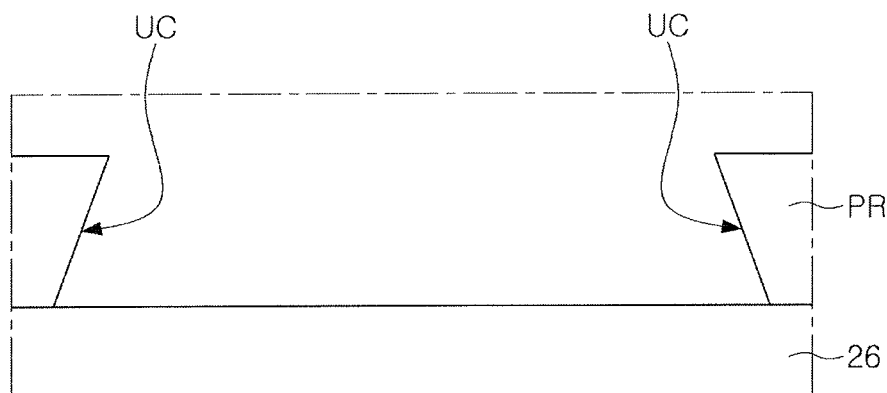
FIGS. 2A to 2C illustrate cross-sectional views of stages in a method of forming an electrode of FIG. 1.
Figure 2B:
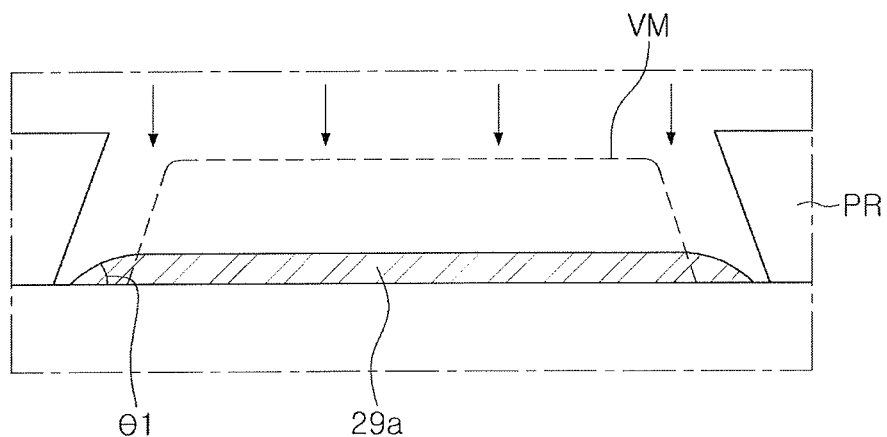
Figure 2C:
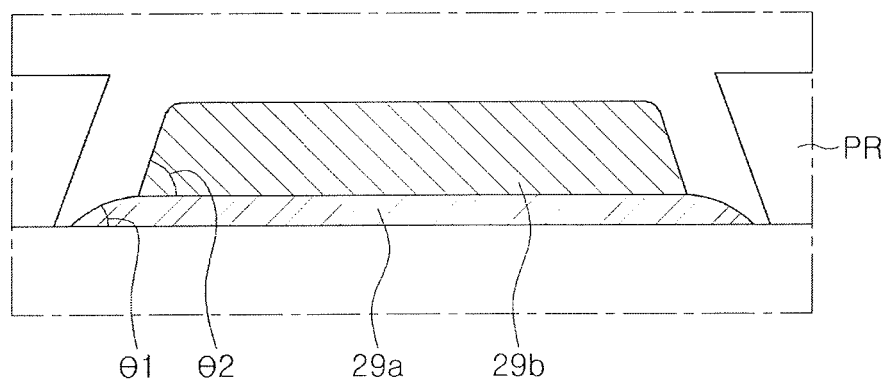

FIGS. 2A to 2C are cross-sectional views illustrating stages in a method of forming the second electrode structure 29. It is noted that FIGS. 2A to 2C correspond to enlarged cross-sectional view of portion A1 of FIG. 1.

Referring to FIG. 2A, a photoresist pattern PR may be formed on the second conductivity-type semiconductor layer 26 using a photolithography process. The photoresist pattern PR employed in the example embodiment may be a negative pattern having an undercut structure UC, e.g., the undercut structure UC of the photoresist pattern PR may include inclined sidewalls facing each other and inclined toward each other that overhang portions of the second conductivity-type semiconductor layer 26.

On a lower region of the undercut structure UC, metal deposition may not be appropriately formed. Thus, for example, in the case of using e-beam evaporation, deposition may be performed along a virtual line VM (dashed line in FIG. 2B), as will be described in more detail below with reference to FIG. 2C.

Referring to FIG. 2B, metal deposition may be performed on a region of the second conductivity-type semiconductor layer 26. For example, the first electrode layer 29a may be formed using a radially uniform deposition process, e.g., sputtering, thereby extending to the lower region of the undercut structure UC, e.g., the undercut structure UC of the photoresist pattern PR may overhang an edge of the resultant first electrode layer 29a. The first electrode layer 29a may be formed of a reflective metal and may extend to the lower region of the undercut structure UC, thereby securing a relatively wide reflective area and obtaining a sufficient contact area with an underlayer, e.g., with the second conductivity-type semiconductor layer 26.

Subsequently, as illustrated in FIG. 2C, the second electrode layer 29b may be formed on the first electrode layer 29a, using the photoresist pattern PR. The second electrode layer 29b may be formed using other deposition processes, e.g., e-beam evaporation, and may be deposited along the virtual line VM noted above. For example, as illustrated in FIG. 2C, the second electrode layer 29b may be formed within an opening defined by the undercut structure UC of the photoresist pattern PR, e.g., a largest width of the second electrode layer 29b (e.g., bottom width directly on the first electrode layer 29a) may be smaller than a smallest width of the opening defined by the undercut structure UC of the photoresist pattern PR (e.g., top width of the photoresist pattern PR) along a direction perpendicular to the stacking direction.

As a result, the first electrode layer 29a, i.e., which is a reflective electrode, may have a larger area than an area of the second electrode layer 29b. For example, the second electrode layer 29b may be only on the internal region E2 of the first electrode layer 29a (FIG. 1) exposed by the undercut structure UC of the photoresist pattern PR, with the edge region E1 of the first electrode layer 29a surrounding the second electrode layer 29b. For example, the edge region E1 of the first electrode layer 29a may have a tail shape in which a cross-section of the edge region is reduced externally when viewed as a cross-section.

As illustrated in FIG. 2C, an inclination angle θ1 of the first electrode layer 29a may be relatively gentle, as compared with an inclination angle θ2 of the second electrode layer 29b. In detail, the edge region E1 of the first electrode layer 29a may have an inclination angle θ1 of about 30° or less when viewed as a cross-section. Light extraction efficiency and luminous flux improvement effects based on the electrode structure in the example embodiment will be described in further detail with reference to FIGS. 6A and 6B.

Figure 3:
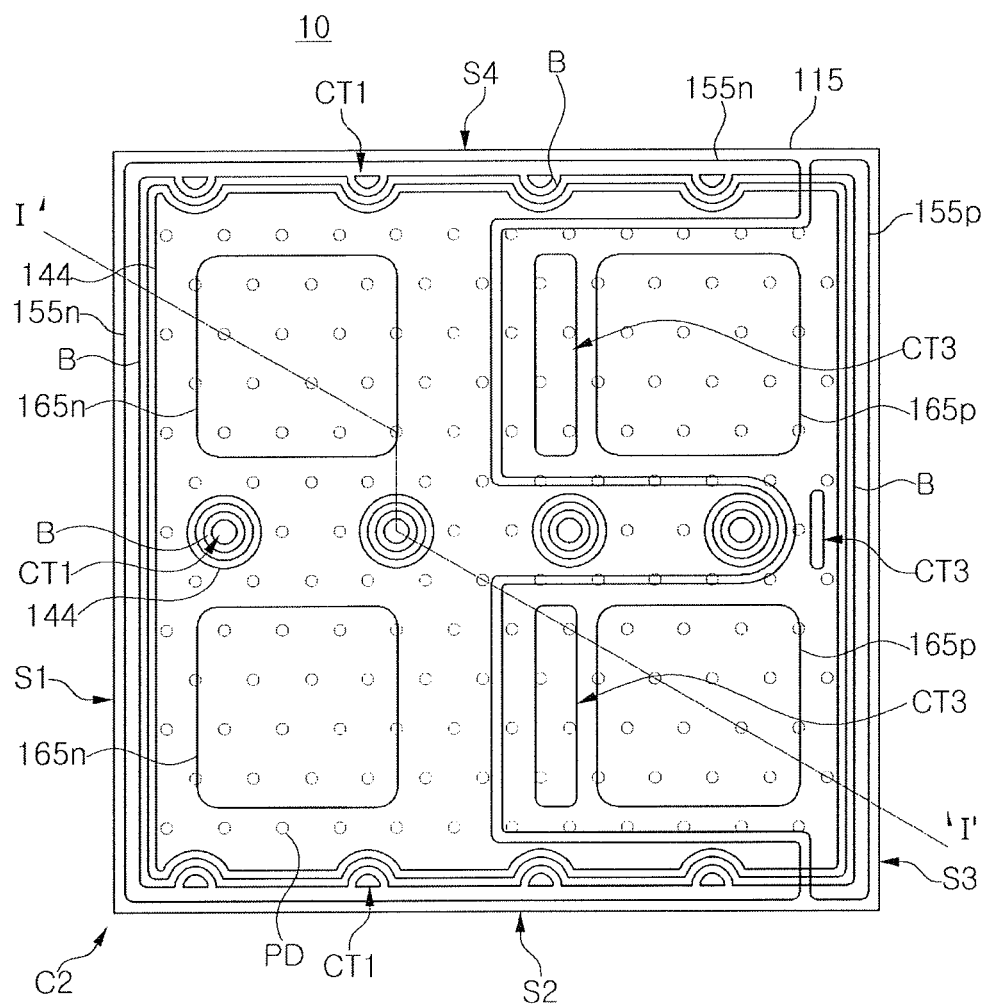
FIG. 3 illustrates a schematic plan view of a semiconductor light emitting device according to an example embodiment.
Figure 4:
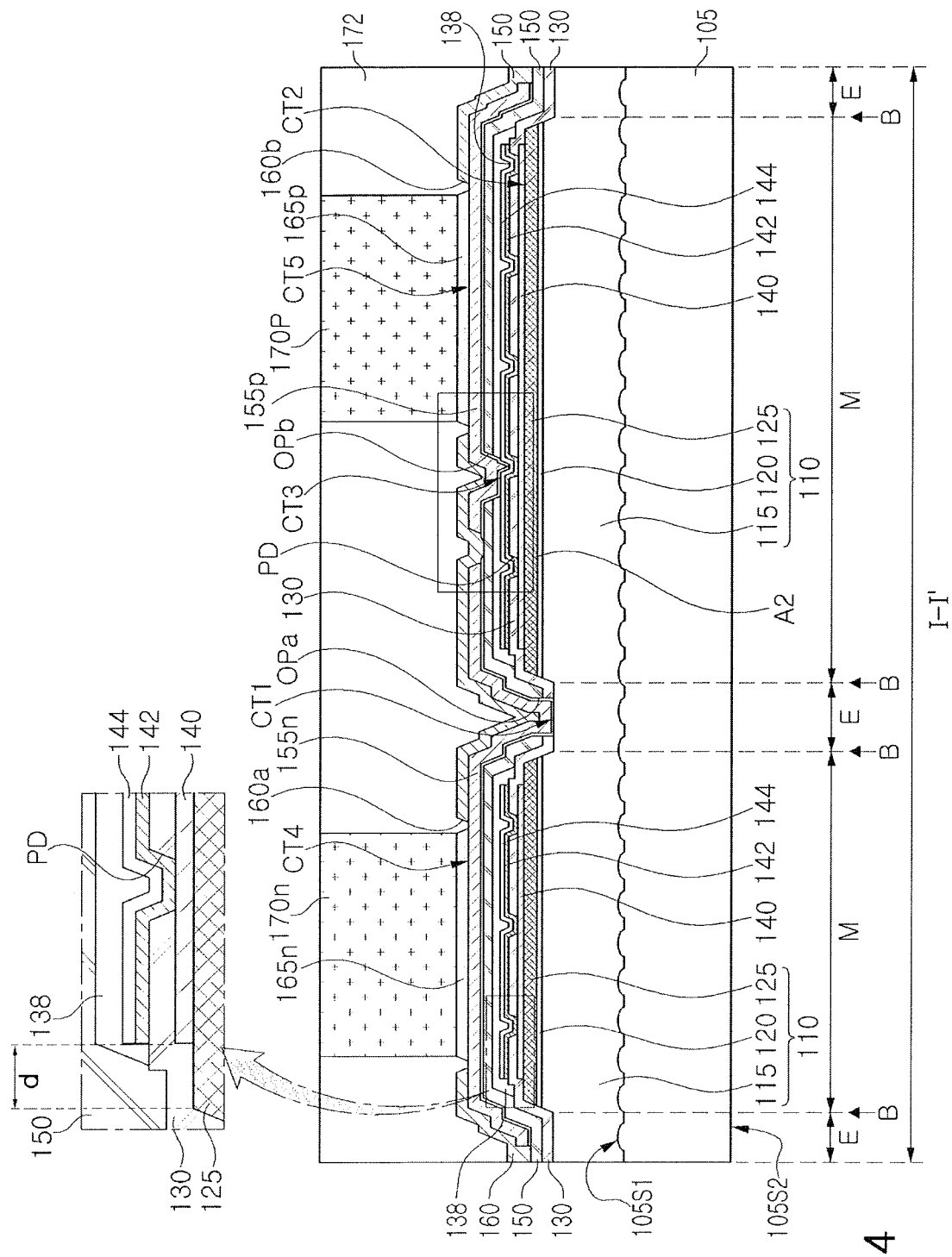
FIG. 4 illustrates a cutaway side cross-sectional view along line I-I' of FIG. 3.

FIG. 3 is a schematic plan view of an example of a semiconductor light emitting device 10 according to an example embodiment, and FIG. 4 is a schematic cross-sectional view along line I-I' of FIG. 3.

Referring to FIGS. 3 and 4, the semiconductor light emitting device 10 according to an example embodiment may include a substrate 105, a light emitting structure 110, a transparent electrode layer 140, a first insulating layer 130 that may also be referred to as an insulating layer hereinafter, and a reflective electrode layer 144. In addition, the semiconductor light emitting device 10 according to the example embodiment may further include a second insulating layer 150, a third insulating layer 160, a first connection electrode 155n, a second connection electrode 155p that may also be referred to as a connection electrode below, a first electrode pad 165n, a second electrode pad 165p, a first solder column 170n, and a second solder column 170p.

The substrate 105 may have a front surface 105s1 and a rear surface 105s2 opposing the front surface 105s1. The substrate 105 may be a semiconductor growth substrate, and may be formed of an insulating, conductive, or semiconductor material, e.g., sapphire, Si, SiC, $MgAl_2O_4$, MgO, $LiAlO_2$, $LiGaO_2$, GaN or the like. The sapphire may be a crystal having hexagonal-rhombo (Hexa-Rhombo R3c) symmetry, while having electrical insulation characteristics, and may be used as a substrate for growth of a nitride semiconductor.

Throughout the specification, terms such as 'front surface', 'rear surface' and the like, are used to distinguish relative positions in components, and the present disclosure is not limited by these terms. The terms, 'front surface', 'rear surface' and the like, may be used to describe components in example embodiments by being replaced with other terms, e.g., 'first surface', 'second surface' and the like, or terms such as 'upper surface' and 'lower surface' and the like. Thus, the front surface 105s1 and the rear surface 105s2 of the substrate 105 may be used by being replaced by an upper surface 105s1 and a lower surface 105s2 of the substrate 105, or a first surface 105s1 and a second surface 105s2 of the substrate 105, respectively.

The light emitting structure 110 may be disposed on the front surface 105s1 of the substrate 105. In an example, the front surface 105s1 of the substrate 105 may have a concavo-convex structure, and the concavo-convex structure may improve crystalline characteristics and light emission efficiency of semiconductor layers constituting the light emitting structure 110. Although the example embodiment illustrates an example in which the concavo-convex structure of the front surface 105s1 of the substrate 105 is illustrated as having a dome-shaped convex shape, an example embodiment thereof is not limited thereto. For example, the concavo-convex structure of the front surface 105s1 of the substrate 105 may be formed to have various shapes such as a quadrangular shape, a triangular shape, and the like. In addition, the concavo-convex structure of the front surface 105s1 of the substrate 105 may be selectively formed, and may also be omitted.

In an example, the substrate 105 may also be removed later, depending on an example embodiment. For example, the substrate 105 may be provided as a growth substrate for growth of the light emitting structure 110, and may then be removed through a separation process. The substrate 105 may be separated from the light emitting structure 110 by a laser lift off (LLO) process, a chemical lift off (CLO) process, or the like.

A buffer layer may be further provided on the front surface 105s1 of the substrate 105. The buffer layer may be provided to relieve a lattice defect of the semiconductor layer grown on the substrate 105, and may be formed of an undoped semiconductor layer formed of nitride or the like. As a material of the buffer layer, undoped GaN, AlN, InGaN or the like may be used, and the buffer layer may be formed by growth to a thickness of several tens to several hundreds of angstroms at a low temperature of about 500° C. to 600° C. In this case, the term 'undoped' indicates that a semiconductor layer is not separately subjected to an impurity doping process. Such a buffer layer is not essential and may be omitted according to an example embodiment.

The light emitting structure 110 may include a first conductivity-type semiconductor layer 115, an active layer 120, and a second conductivity-type semiconductor layer 125.

The first conductivity-type semiconductor layer 115 may be formed by being grown from the front surface 105s1 of the substrate 105. The first conductivity-type semiconductor layer 115 may include a semiconductor doped with an n-type impurity, and may be an n-type nitride semiconductor layer.

As illustrated in FIG. 3, the first conductivity-type semiconductor layer 115 may have a first edge S1, a second edge S2, a third edge S3, and a fourth edge S4. The first and third edges S1 and S3 may oppose each other, and the second and fourth edges S2 and S4 may oppose each other.

The second conductivity-type semiconductor layer 125 may include a semiconductor doped with a p-type impurity, and may be provided as a p-type nitride semiconductor layer. In another example embodiment, positions of the first and second conductivity-type semiconductor layers 115 and 125 may be changed, to be stacked on each other. The first and second conductivity-type semiconductor layers 115 and 125 may be represented by empirical formula $Al_xIn_yGa_{(1-x-y)}N$ (0≤x<1, 0≤y<1, 0≤x+y<1), which may correspond to a material, e.g., GaN, AlGaN, InGaN, AlInGaN, or the like.

The active layer 120 may be interposed between the first and second conductivity-type semiconductor layers 115 and 125. The active layer 120 may emit light having a predetermined energy level by the recombination of electrons and holes when the semiconductor light emitting device 10 operates. The active layer 120 may include a material having an energy band gap narrower than an energy band gap of the first and second conductivity-type semiconductor layers 115 and 125. For example, when the first and second conductivity-type semiconductor layers 115 and 125 are formed of GaN compound semiconductors, the active layer 120 may include an InGaN compound semiconductor having an energy band gap narrower than the energy band gap of GaN. In addition, the active layer 120 may have a multiple quantum well (MQW) structure in which a quantum well layer and a quantum barrier layer are alternately stacked, for example, may have an InGaN/GaN structure. However, an example embodiment thereof is not limited thereto, and the active layer 120 may have a single quantum well (SQW) structure.

The light emitting structure 110 may include a recessed region (E) obtained by etching portions of the second conductivity-type semiconductor layer 125, the active layer 120, and the first conductivity-type semiconductor layer 115, and a mesa region (M) around the recessed region (E). In the drawings, reference character 'B' may denote a boundary (B) between the recessed region (E) and the mesa region (M). An upper surface of the mesa region (M) may be higher than an upper surface of the recessed region (E). In an example, the mesa region (M) may have a shape gradually narrowed from a lower portion to an upper portion. Thus, the mesa region (M) may have an inclined side surface.

In an example, a portion of an upper surface of the recessed region (E) may be defined as a first contact region CT1. In an example, at least a portion of an upper surface of the mesa region (M) may be defined as a second contact region CT2.

The mesa region (M) may be spaced apart from the first to fourth edges S1 to S4, and the recessed region (E) may be disposed between the mesa region (M) and the first to fourth edges S1 to S4. In addition, recessed regions (E) having a circular shape and spaced apart from each other may further be disposed in a central portion of the light emitting structure 110.

The transparent electrode layer 140 may be disposed on the second conductivity-type semiconductor layer 125 of the light emitting structure 110. The transparent electrode layer 140 may be disposed on the second contact region CT2 of the second conductivity-type semiconductor layer 125, to be connected to the second conductivity-type semiconductor layer 125.

In the example embodiment, the transparent electrode layer 140 may be disposed to be spaced apart from an edge of the second conductivity-type semiconductor layer 125 by a predetermined distance. For example, as illustrated in FIG. 4, an outermost edge of the transparent electrode layer 140 may be horizontally spaced apart from an outermost edge of the second conductivity-type semiconductor layer 125, so a portion of an upper surface of the second conductivity-type semiconductor layer 125 at an edge thereof may be exposed, e.g., to directly contact the first insulating layer 130.

As the transparent electrode layer 140 is spaced apart from the mesa region (M), i.e., from the edge region of the second conductivity-type semiconductor layer 125, a problem due to light absorption of a transparent electrode layer in an edge region of a mesa region (M) may be prevented, and luminous flux in an edge region relevant thereto may be improved by the first insulating layer having a DBR structure or an ODR structure of the first insulating layer 130 and the reflective electrode layer 144. In order to obtain sufficient effects, an interval distance "d" of the transparent electrode layer 140 from an edge of the second conductivity-type semiconductor layer 125 may be about 2 μm or more.

The first insulating layer 130 may be disposed on the transparent electrode layer 140. The first insulating layer 130 may cover a portion of the first conductivity-type semiconductor layer 115 and a portion of the second conductivity-type semiconductor layer 125. The first insulating layer 130 may include a plurality of holes PD located in the mesa region (M). The first insulating layer 130 may partially cover the transparent electrode layer 140 in the mesa region (M),
e.g., the first insulating layer 130 may partially cover the transparent electrode layer 140 and the exposed edge of the second conductivity-type semiconductor layer 125. Although the example embodiment illustrates that the plurality of holes PD are arranged in a dense hexagonal lattice pattern, an example embodiment thereof is not limited thereto. For example, the plurality of holes PD may be arranged in various forms, e.g., a quadrangular grid shape or the like. Although the plurality of holes PD are illustrated as having a circular cross-section, an example embodiment thereof is not limited thereto. For example, the plurality of holes PD may have a polygonal or ring-shaped cross-section.

For example, the transparent electrode layer 140 may include at least one of indium tin oxide (ITO), zinc-doped indium tin oxide (ZITO), zinc indium oxide (ZIO), gallium indium oxide (GIO), zinc tin oxide (ZTO), fluorine-doped tin oxide (FTO), aluminum-doped zinc oxide (AZO), gallium-doped zinc oxide (GZO), $In_4Sn_3O_{12}$, and $Zn_{(1-x)}Mg_xO$ (Zinc Magnesium Oxide, $0 \leq x \leq 1$). A thickness of the transparent electrode layer 140 may be within a range of about 1 nm to 5 nm, but is not limited thereto.

For example, the first insulating layer 130 may include at least one of $SiO_2$, SiN, $SiO_xN_y$, $TiO_2$, $Si_3N_4$, $Al_2O_3$, TiN, AlN, $ZrO_2$, TiAlN, TiSiN, HfO, $TaO_2$ and $MgF_2$. In an example embodiment, the first insulating layer 130 may have a multilayer film structure in which insulation films having different refractive indexes are alternately stacked, and may be provided as a distributed Bragg reflector (DBR). The multilayer film structure may be a structure in which a first insulating film and a second insulating film having a first refractive index and a second refractive index, as different refractive indexes, are alternately stacked.

In another example embodiment, the first insulating layer 130 may be formed of a material having a refractive index lower than that of the second conductivity-type semiconductor layer 125. The first insulating layer 130 may constitute an omnidirectional reflector (ODR) together with the reflective electrode layer 144 disposed to contact an upper portion of the first insulating layer 130. As such, the first insulating layer 130 may be used alone or in combination with the reflective electrode layer 144, as a reflective structure increasing reflectivity of light emitted by the active layer 120, and thus, light extraction efficiency may be significantly increased.

The reflective electrode layer 144 may be disposed on the first insulating layer 130, to be electrically connected to the transparent electrode layer 140 via the plurality of holes PD. For example, the reflective electrode layer 144 may include Ag, Cr, Ni, Ti, Al, Rh, Ru or combinations thereof.

In addition, a bonding electrode layer 142 may be disposed between the first insulating layer 130 and the reflective electrode layer 144. The bonding electrode layer 142 may be in contact with the transparent electrode layer 140 through the plurality of holes PD. The bonding electrode layer 142 may improve adhesive properties between the reflective electrode layer 144 and the first insulating layer 130.

The bonding electrode layer 142 may be formed of a material similar to that of the transparent electrode layer 140. For example, the bonding electrode layer 142 may include at least one of ITO, ZITO, ZIO, GIO, ZTO, FTO, AZO, GZO, $In_4Sn_3O_{12}$ and $Zn_{(1-x)}Mg_xO(0 \leq x \leq 1)$.

A transparent protective layer 138 may protect the reflective electrode layer 144 while covering an upper surface and a side surface of the reflective electrode layer 144. The transparent protective layer 138 may cover a side surface of the bonding electrode layer 142. The transparent protective layer 138 may include an upper surface portion R1 having a convex surface while covering an upper surface of the reflective electrode layer 144, and a side surface portion R2 having an inclined surface while covering a side surface of the reflective electrode layer 144 and a side surface of the bonding electrode layer 142. By forming the transparent protective layer 138, adhesive properties of the reflective electrode layer 144 may be improved, and migration of a metal element forming the reflective electrode layer 144 may be suppressed.

The transparent protective layer 138 may be formed of a transparent conductive material or a transparent insulation material. The transparent conductive material may include at least of ITO, ZITO, ZIO, GIO, ZTO, FTO, AZO, GZO, $In_4Sn_3O_{12}$ and $Zn_{(1-x)}Mg_xO(0 \leq x \leq 1)$, or a conductive polymer. The transparent insulating material may include at least one of $SiO_2$, SiN, $TiO_2$, HfO, $TaO_2$ and $MgF_2$. The second insulating layer 150 may be disposed on the transparent protective layer 138 and the first insulating layer 130.

Figure 5:
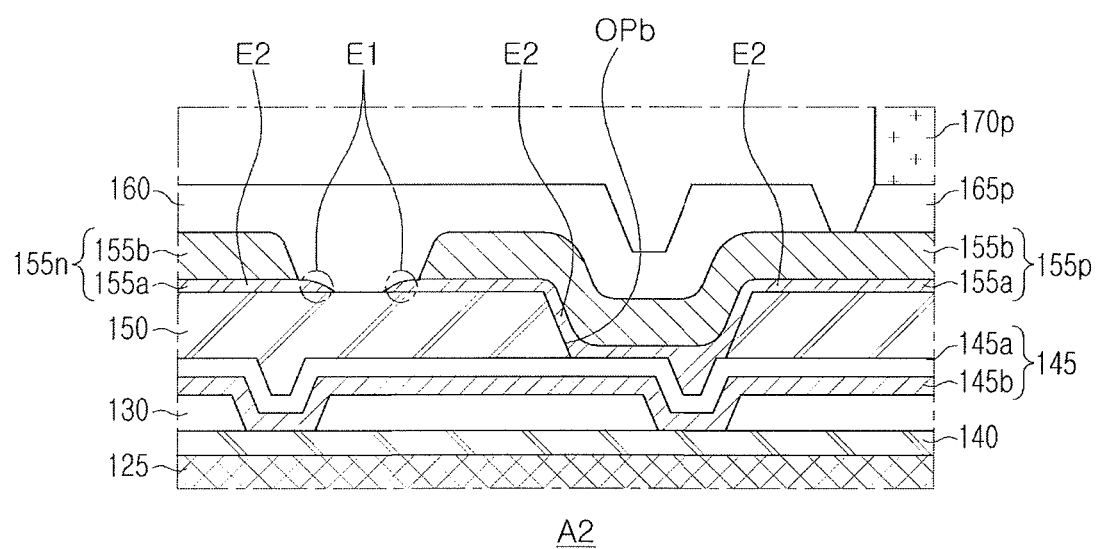
FIG. 5 illustrates a partially enlarged cross-sectional view of portion A2 of FIG. 4.

For example, referring together with FIG. 5, when the transparent protective layer 138 is formed of a transparent insulating material, a first opening OPa penetrating through the first insulating layer 130 and the second insulating layer 150 to expose the first contact region CT1, and a second opening OPb exposing a third contact region CT3, may be formed. The first opening OPa may be located in the recessed region (E), and the second opening OPb may be located in the mesa region (M).

The first connection electrode 155*n* may be disposed on the second insulating layer 150, and may extend onto the first contact region CT1 of the first conductivity-type semiconductor layer 115 via the first opening OPa to be electrically connected to the first conductivity-type semiconductor layer 115. The first connection electrode 155*n* may be in contact with the first contact region CT1 of the first conductivity-type semiconductor layer 115. In an example, a buffer layer may be disposed between the first connection electrode 155*n* and the first contact region CT1 of the first conductivity-type semiconductor layer 115, to improve contact resistance characteristics between the first connection electrode 155*n* and the first contact region CT1 of the first conductivity-type semiconductor layer 115.

The second connection electrode 155*p* may be disposed on the second insulating layer 150, and may extend to an upper portion of the third contact region CT3 of the reflective electrode layer 144 through the second opening OPb to be electrically connected to the reflective electrode layer 144. Thus, the second connection electrode 155*p* may be electrically connected to the second conductivity-type semiconductor layer 125 through the reflective electrode layer 144.

Alternatively, for example, when the transparent protective layer 138 is formed of a transparent conductive material, the second opening OPb may be formed to penetrate through the second insulating layer 150 to expose a contact region of the transparent protective layer 138. The second connection electrode 155*p* may be disposed on the second insulating layer 150, and may be connected to the transparent protective layer 138 through the second opening OPb to be electrically connected to the reflective electrode layer 144 and the second conductivity-type semiconductor layer 125.

The first connection electrode 155*n* and the second connection electrode 155*p* may be configured to be disposed on the second insulating layer 150, may be formed of the same material, and may be separated from each other. When viewed from above, the first connection electrode 155*n* may be in contact with the first edge S1, and the second connection electrode 155*p*, which may be referred to as a 'connection electrode', may be in contact with the third edge S3.

The third insulating layer 160 may be disposed on the first connection electrode 155*n* and the second connection electrode 155*p*, and may have a third opening 160*a* exposing a fourth contact region CT4 of the first connection electrode 155*n*, and a fourth opening 160*b* exposing a fifth contact region CT5 of the second connection electrode 155*p*. For example, the first connection electrode 155*n* and the second connection electrode 155*p* may be formed of a material including one or more of Al, Au, W, Pt, Si, Ir, Ag, Cu, Ni, Ti, Cr, and alloys thereof.

As illustrated in FIG. 5, each of the first connection electrode 155*n* and the second connection electrode 155*p* employed in the example embodiment may include a first electrode layer 155*a* including an edge region E1 and an internal region E2 surrounded by the edge region E1, and a second electrode layer 155*b* disposed on the internal region E2 of the first electrode layer 155*a*. The first and second electrode layers 155*a* and 155*b* may be the same as the first and second electrode layers 29*a* and 29*b*, respectively, described previously with reference to FIGS. 1-2C.

That is, the edge region E1 of the first electrode layer 155*a* may have a thickness less than that of the internal region E2 of the first electrode layer 155*a*. The edge region E1 of the first electrode layer 155*a* may have a thickness gradually reduced externally. As such, the first electrode layer 155*a* may be formed to be wider than the second electrode layer 155*b*, and may protrude outwardly of, e.g., beyond, the second electrode layer 155*b* to have a tail shape. An inclination angle of a tail portion in a cross-section thereof in a thickness direction may be about 30 degrees or less.

In the example embodiment, the first electrode layer 155*a* and the second electrode layer 155*b* may be functionally separated layers. For example, the first electrode layer 155*a* may include a reflective layer, and the second electrode layer 155*b* may be provided as a current spreading layer. For example, the first electrode layer 155*a* may include at least one of Ag, Cr, Ni, Ti, Al, Rh, Ru, Pd, Au, Cu and combinations thereof, e.g., at least one of Ag and Al. The second electrode layer 155*b* may include at least one of Au and Cu. The second electrode layer 155*b* may have a thickness greater than that of the first electrode layer 155*a*, to exhibit a sufficient current spreading function.

Figure 6A:
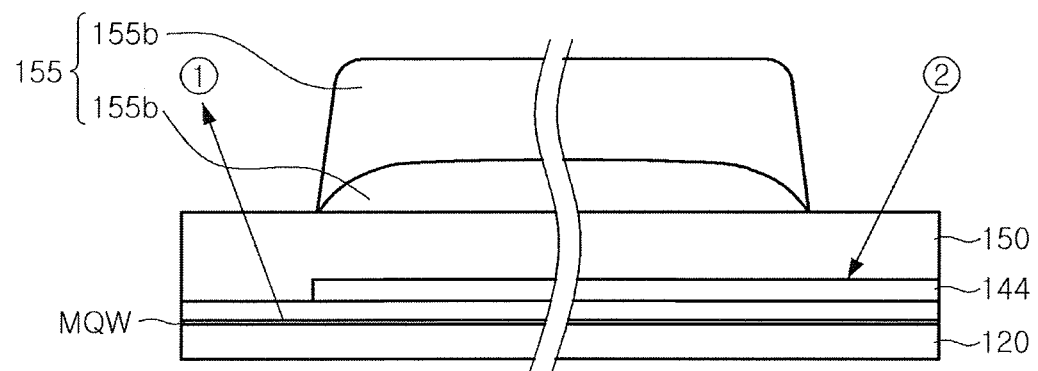
FIGS. 6A and 6B illustrate schematic views of light extraction effects of connection electrode structures.
Figure 6B:
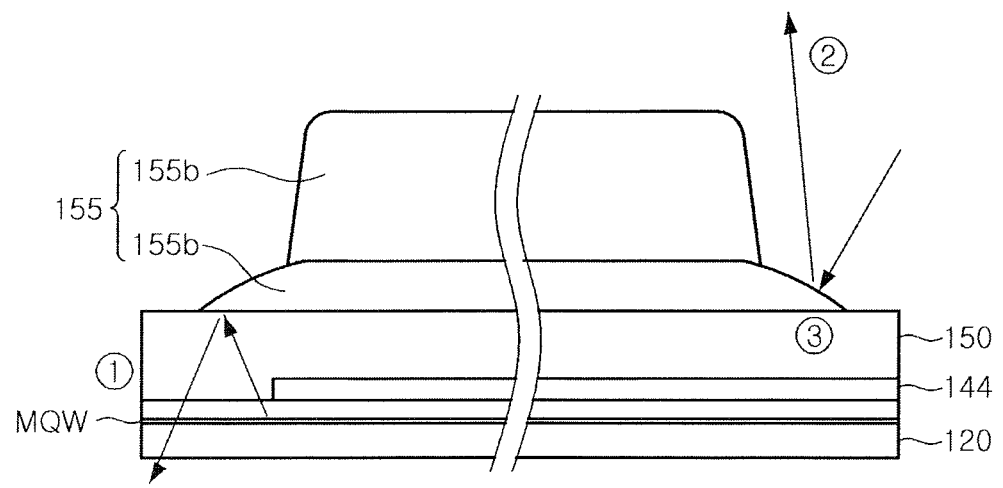

FIGS. 6A and 6B are drawings illustrating light extraction effects of connection electrode structures. FIG. 6A illustrates a connection electrode structure according to a comparative embodiment, while FIG. 6B illustrates a connection electrode structure according to an example embodiment.

Referring to FIGS. 6A and 6B, in the case of the connection electrode 155 according to the example embodiment, since an area of the first electrode layer 155*a* (used as a reflective layer) increases, as compared with that of a connection electrode 155' of the comparative example in FIG. 6A, light (see ①) emitted by a MQW structure may be more effectively reflected toward a substrate. Further, an amount of light (see ②) re-reflected from a package and then absorbed into a metal region of a device may be reduced, thereby significantly improving luminous flux characteristics of the device. In addition, in the connection electrode 155 according to the example embodiment, since the area of the first electrode layer 155*a* increases, adhesive properties of the first electrode layer 155*a* with the second insulating layer 150 that is an underlayer film, may be improved, thereby increasing product reliability.

As discussed previously, the connection electrode 155 employed in the example embodiment may be formed by the process illustrated in FIGS. 2A to 2C as described above. In detail, the connection electrode 155 may be implemented by performing different deposition processes with respect to the first and second electrode layers 155a and 155b, using a negative photoresist pattern having an undercut structure. For example, the first electrode layer 155a may be formed using a sputtering process providing relatively high radial and angular uniformity, and the second electrode layer 155b may be formed on the first electrode layer 155a through an opening with an undercut structure by electron-beam evaporation.

In the example embodiment, the first and second connection electrodes 155n and 155p may further include a conductive bonding layer disposed between the first electrode layer 155a and the second insulating layer 150, or a conductive barrier layer disposed between the first electrode layer 155a and the second electrode layer 155b. The conductive bonding layer and the conductive barrier layer may include at least one of Cr, Ti, and Ni, or a transparent electrode material such as ITO. The conductive bonding layer and the conductive barrier layer may be formed by subsequently performing the same deposition process as that of the first electrode layer 155a, e.g., sputtering. Thus, the conductive bonding layer and the conductive barrier layer may be formed to have an area similar to that of the first electrode layer 155a. The first electrode layer 155a may be formed of a plurality of pairs, together with the conductive barrier layer, e.g., a Cr layer.

A first electrode pad 165n may be disposed on the fourth contact region CT4 of the first connection electrode 155n, and a second electrode pad 165p may be disposed on the fifth contact region CT5 of the second connection electrode 155p. A first solder column 170n may be disposed on the first electrode pad 165n, and a second solder column 170p may be disposed on the second electrode pad 165p. The first and second solder columns 170n and 170p may be formed of a conductive material, e.g., Sn, AuSn, or the like.

The first and second solder columns 170n and 170p may be provided with a molding portion 172 covering side surfaces of the first and second solder columns 170n and 170p. The molding portion 172 may include light reflective powder particles, e.g., $TiO_2$, $Al_2O_3$ and the like. An upper surface of the molding portion 172 may be lower than upper surfaces of the first and second solder columns 170n and 170p.

Referring to FIG. 5, the semiconductor light emitting device may include the direct reflective electrode layer 144 on the first insulating layer 130 without the bonding electrode layer 142. In addition, the transparent protective layer 138 may also be omitted as required. In another example embodiment, the semiconductor light emitting device may further include a capping electrode layer disposed on the reflective electrode layer 144. The capping electrode layer may have a multilayer structure, e.g., in which titanium (Ti) and nickel (Ni) are alternately stacked.

Hereinafter, an example of a method of manufacturing the semiconductor light emitting device 10 according to an example embodiment will be described with reference to FIGS. 7 to 20. FIGS. 7, 9, 11, 13, 15, 17 and 19 are schematic plan views of stages in a method of manufacturing the semiconductor light emitting device 10 according to an example embodiment. FIGS. 8, 10, 12, 14, 16, 18 and 20 are schematic cross-sectional views taken along line I-I' of FIGS. 7, 9, 11, 13, 15, 17 and 19, respectively.

Figure 7:
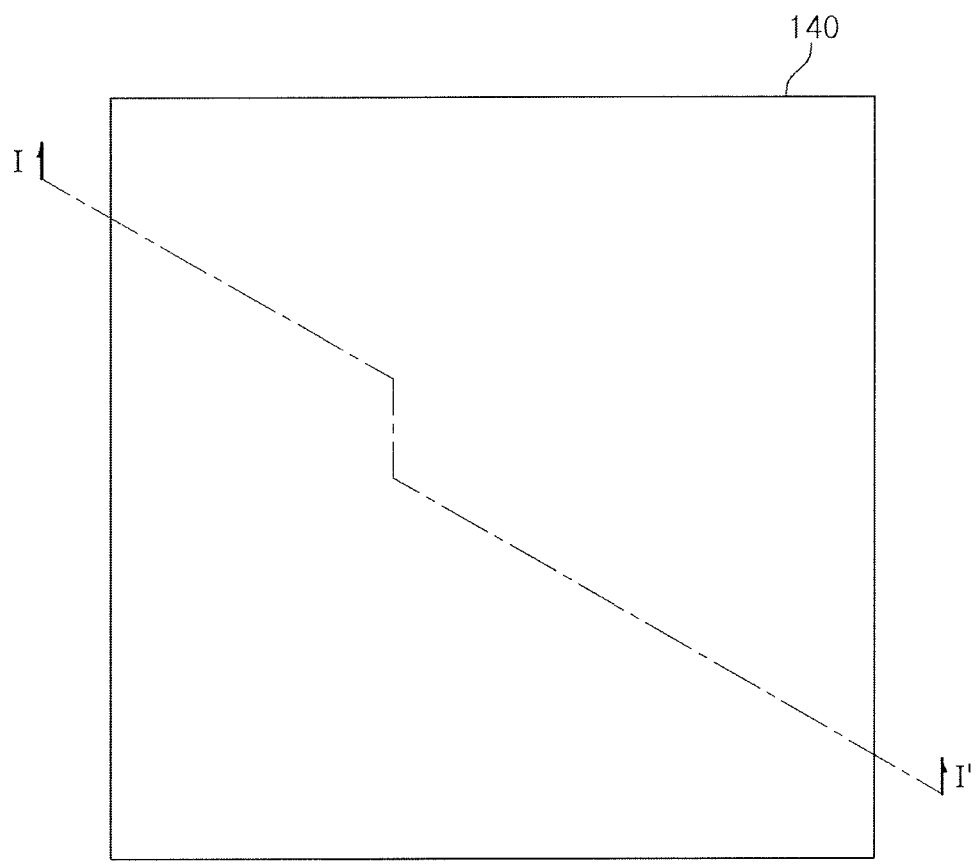
FIGS. 7, 9, 11, 13, 15, 17 and 19 illustrate plan views of stages in a method of manufacturing a semiconductor light emitting device according to an example embodiment.
Figure 8:
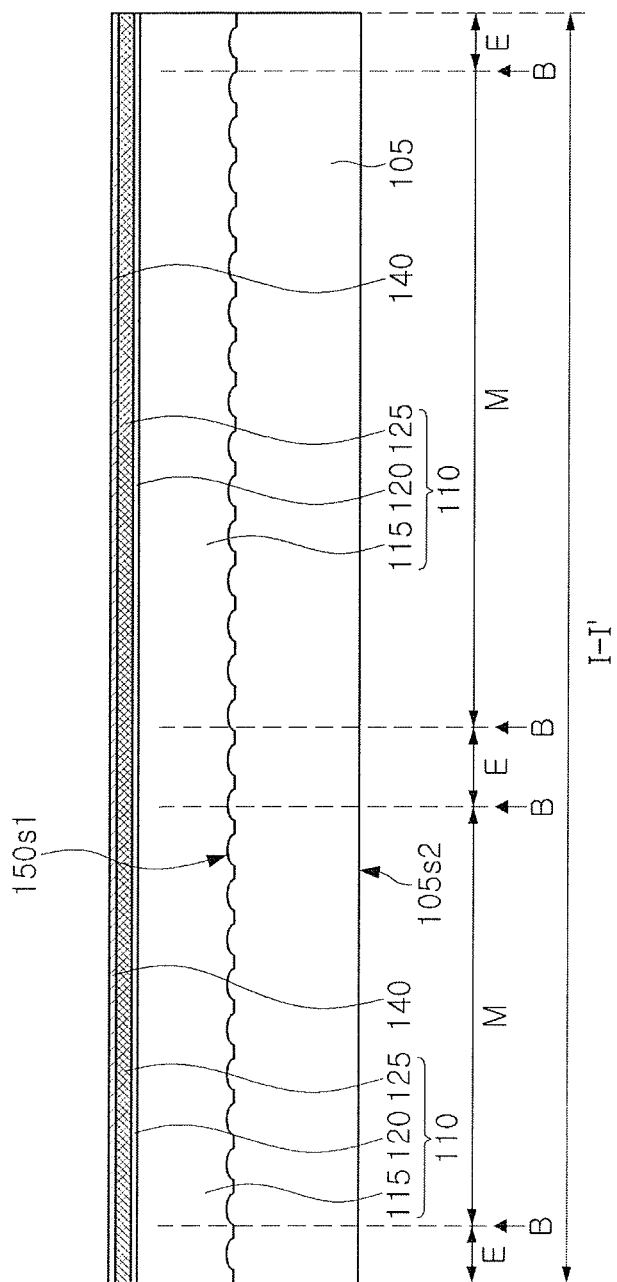
FIGS. 8, 10, 12, 14, 16, 18 and 20 illustrate cross-sectional views of stages in a method of manufacturing a semiconductor light emitting device according to an example embodiment.

Referring to FIGS. 7 and 8, the light emitting structure 110 may be formed on the substrate 105. The substrate 105 may have the front surface 105s1 and the rear surface 105s2 opposing the front surface 105s1.

In an example, a concavo-convex structure may be formed on the front surface 105s1 of the substrate 105. According to an example embodiment, forming the concavo-convex structure on the front surface 105s1 of the substrate 105 may be omitted.

The light emitting structure 110 may be formed on the front surface 105s1 of the substrate 105. The light emitting structure 110 may be formed of a plurality of layers formed using a process, e.g., metal organic chemical vapor deposition (MOCVD), hydride vapor phase epitaxy (HVPE), molecular beam epitaxy (MBE), or the like. For example, the light emitting structure 110 may include the first conductivity-type semiconductor layer 115, the active layer 120, and the second conductivity-type semiconductor layer 125, sequentially formed on the front surface 105s1 of the substrate 105. The first conductivity-type semiconductor layer 115 and the second conductivity-type semiconductor layer 125 may have different conductivity-types. For example, the first conductivity-type semiconductor layer 115 may have n-type conductivity, and the second conductivity-type semiconductor layer 125 may have p-type conductivity. In addition, the transparent electrode layer 140 may be formed on the light emitting structure 110.

Figure 9:
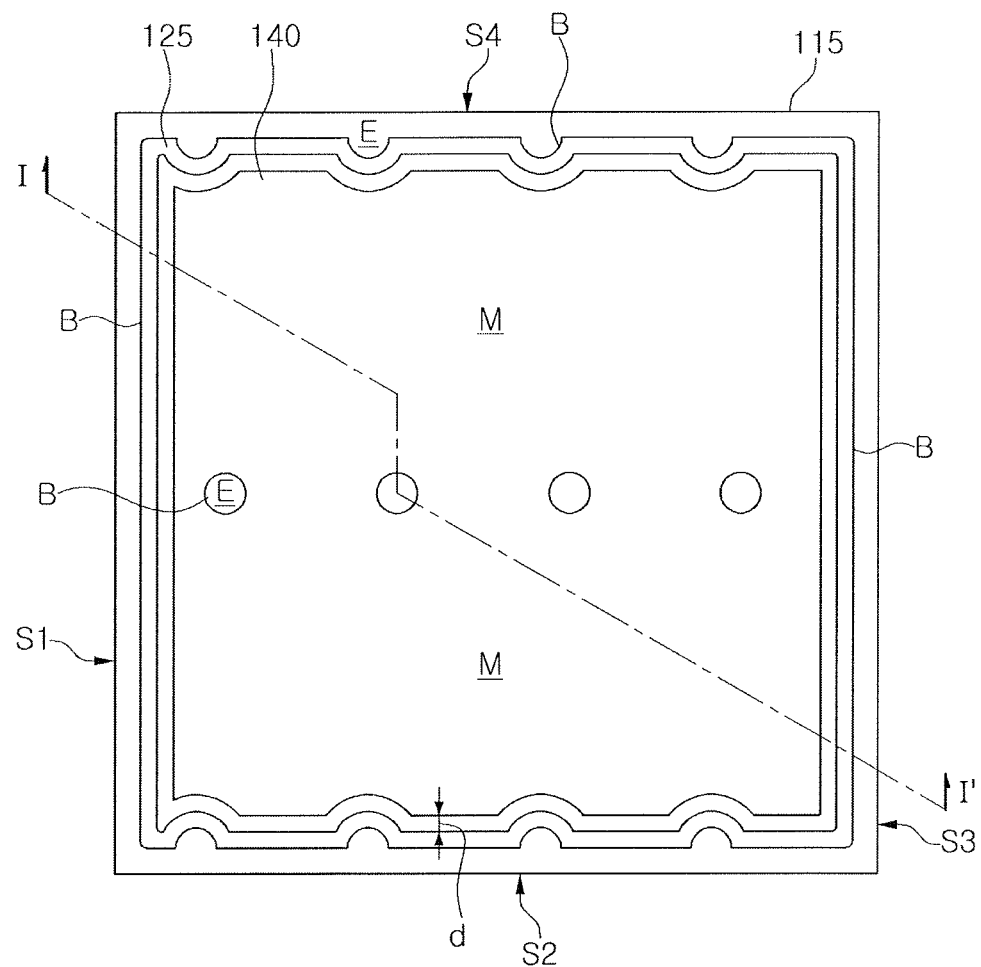
Figure 10:
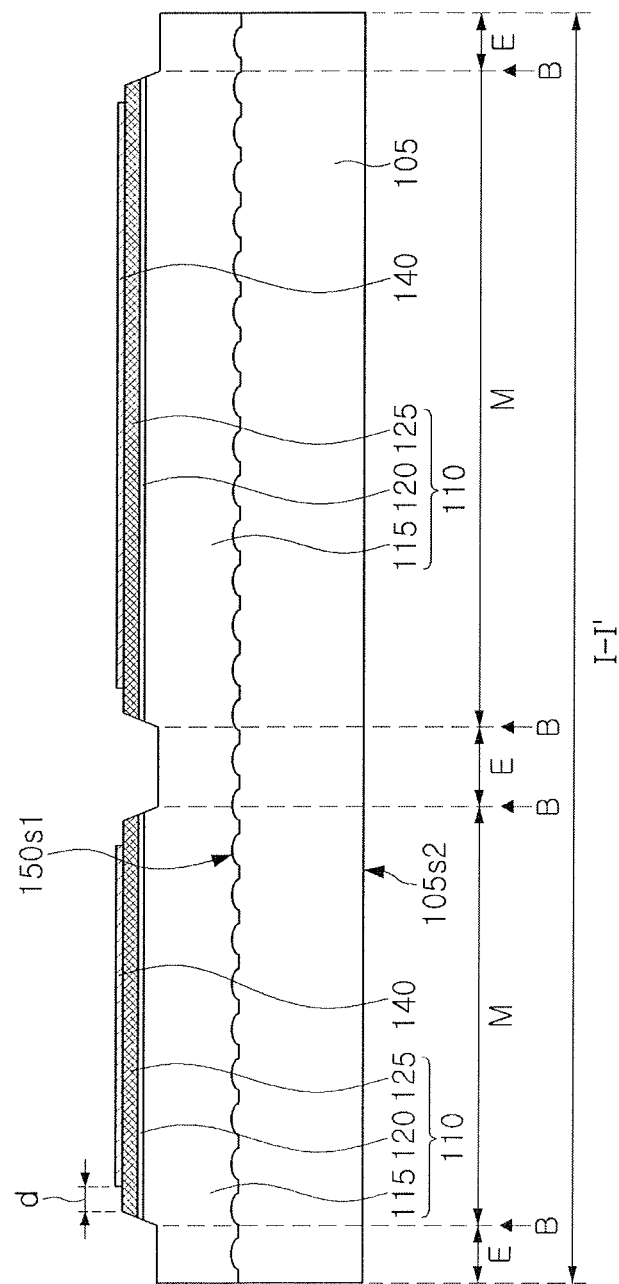

Referring to FIGS. 9 and 10, portions of the transparent electrode layer 140, the second conductivity-type semiconductor layer 125, the active layer 120, and the first conductivity-type semiconductor layer 115 may be etched using a photolithography process. In the photolithography process, etching of the transparent electrode layer 140, e.g., wet etching, and etching of the light emitting structure 110, e.g., dry etching, may be sequentially performed.

The light emitting structure 110 may include the recessed region E obtained by removing portions of the second conductivity-type semiconductor layer 125, the active layer 120, and the first conductivity-type semiconductor layer 115, and the mesa region M therearound. The mesa region M may be defined as a region in which the second conductivity-type semiconductor layer 125, the active layer 120, and the first conductivity-type semiconductor layer 115 are not etched. The mesa region M may have a relatively protruding shape, compared to that of the recessed region E. The recessed region E may also be referred to as an etched region.

The transparent electrode layer 140 may be disposed to be spaced apart from an edge of the second conductivity-type semiconductor layer 125 by a predetermined interval. A spacing distance d of the edge of the transparent electrode layer 140 from the edge of the second conductivity-type semiconductor layer 125, as illustrated in FIG. 9, based on a shortest distance, may be set to be about 2 μm or more. The spacing distance d may be obtained by overetching (etching time) the transparent electrode layer 140.

As described above, the transparent electrode layer 140 may be spaced apart from an edge region of the second conductivity-type semiconductor layer 125, thereby preventing occurrence of a problem due to light absorption of the transparent electrode layer 140 in an edge region and improving luminous flux.

Figure 11:
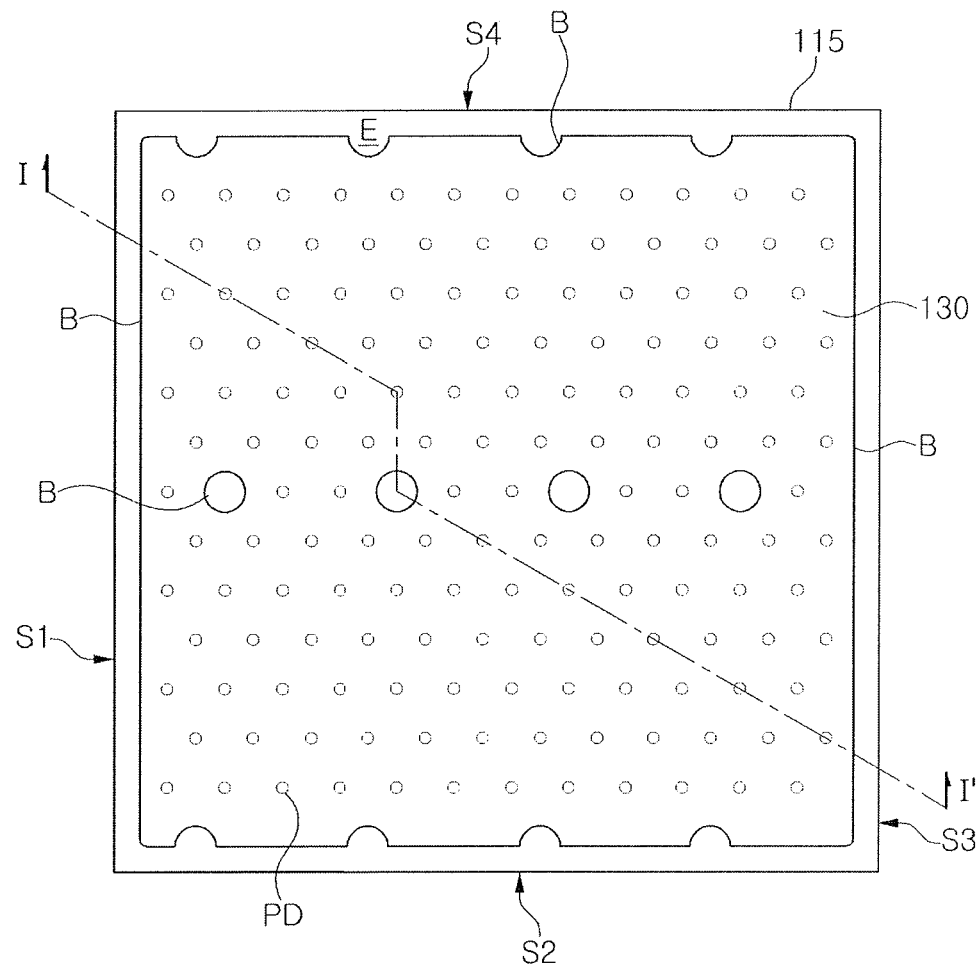
Figure 12:
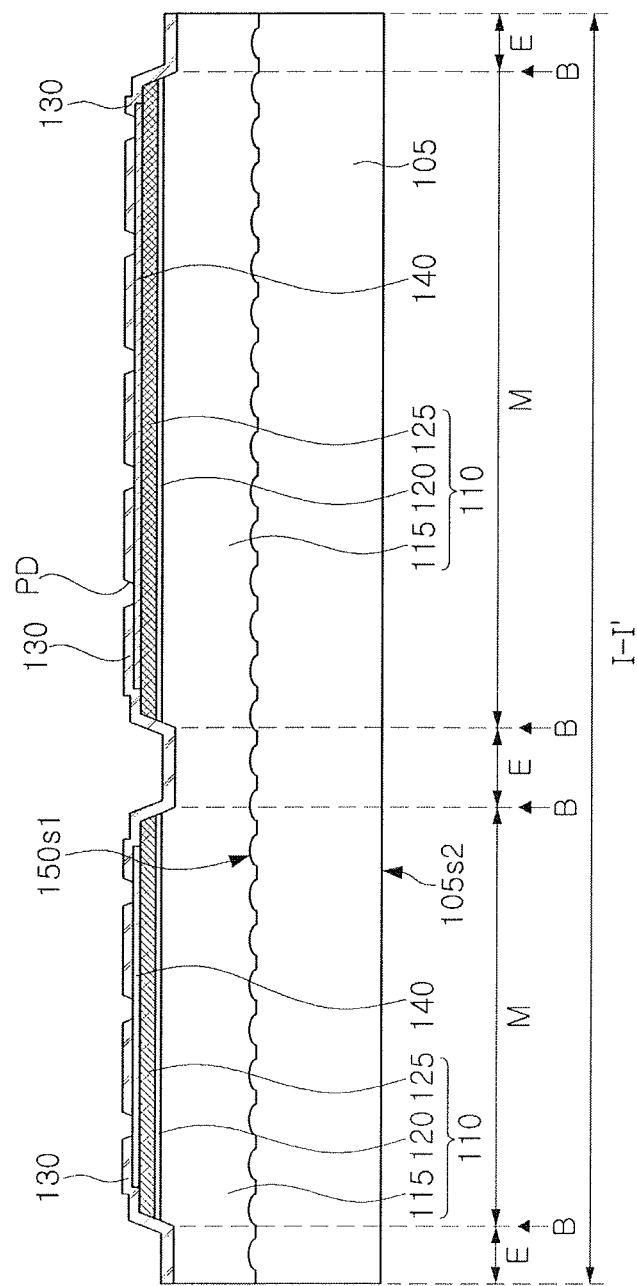

Referring to FIGS. 11 and 12, the first insulating layer 130 including a plurality of holes PD may be formed on the light emitting structure 110. The first transparent protective layer 135 and the first insulating layer 130 may be sequentially formed on the transparent electrode layer 140, and the plurality of holes PD may penetrate through the first insulating layer 130 to expose a portion of the transparent electrode layer 140. The plurality of holes PD may be disposed in the mesa region M.

Figure 13:
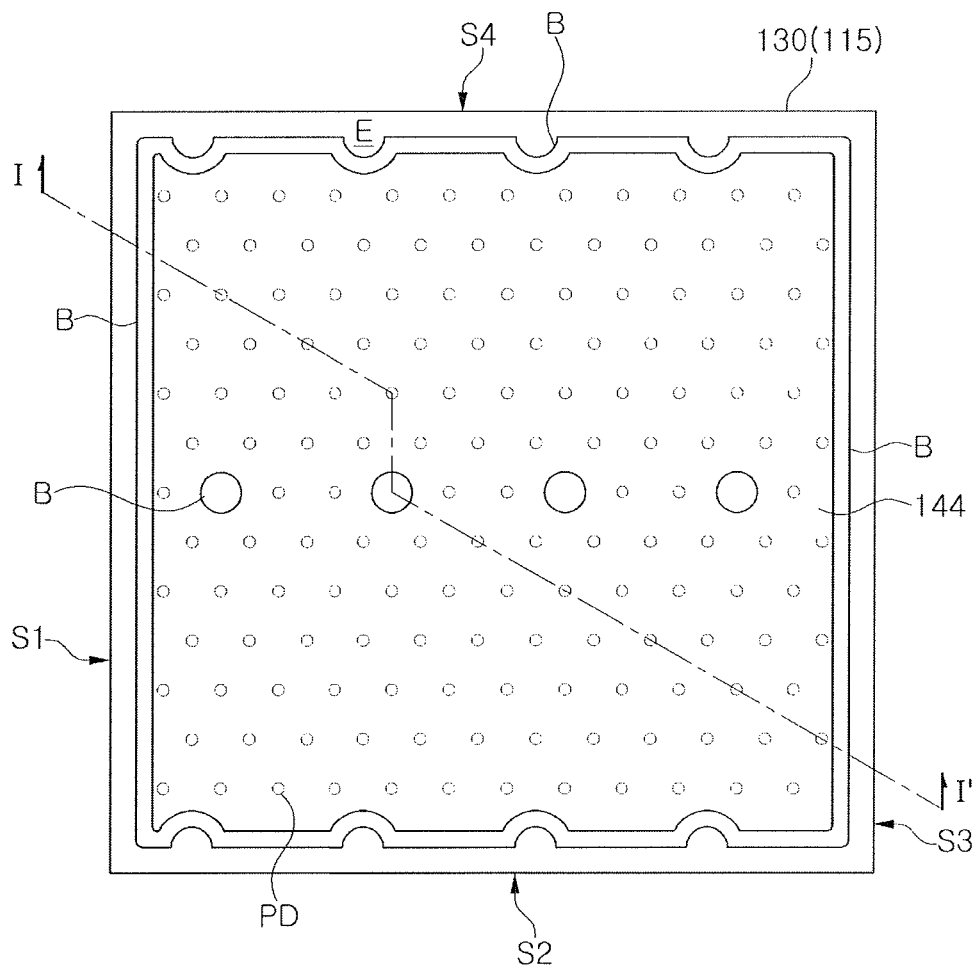
Figure 14:
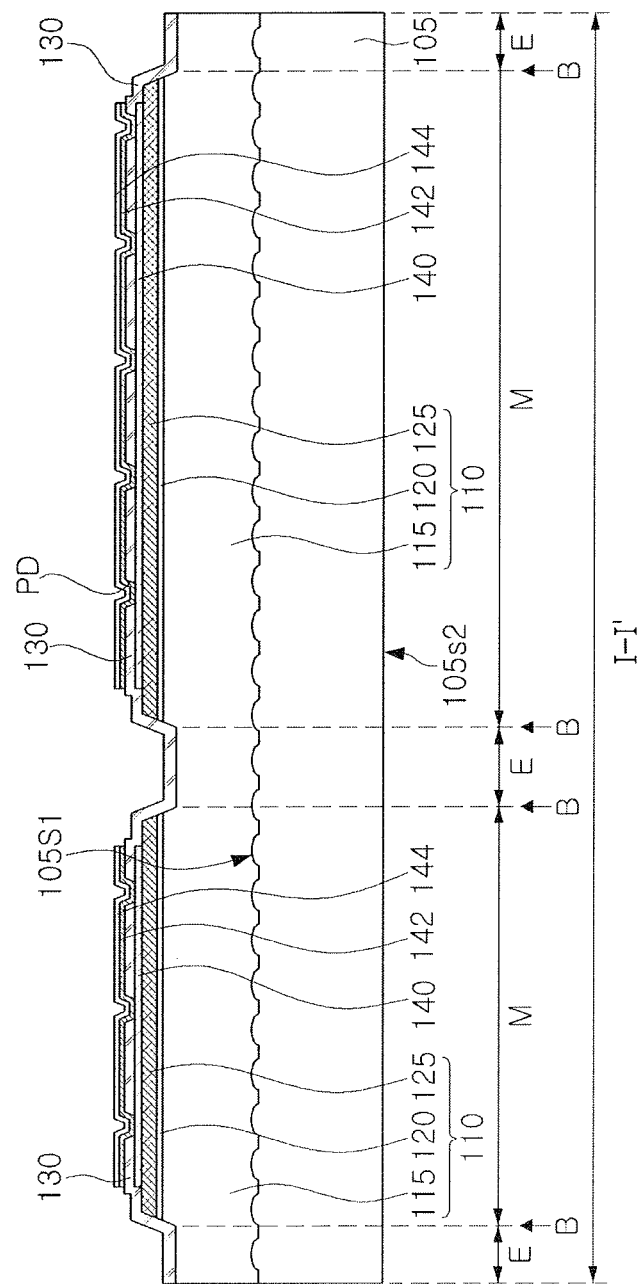

With reference to FIGS. 13 and 14, the bonding electrode layer 142 and the reflective electrode layer 144 may be formed on the first insulating layer 130. The bonding electrode layer 142 and the reflective electrode layer 144 may be formed on the mesa region M, and may be formed on a portion of the first insulating layer 130.

Figure 15:
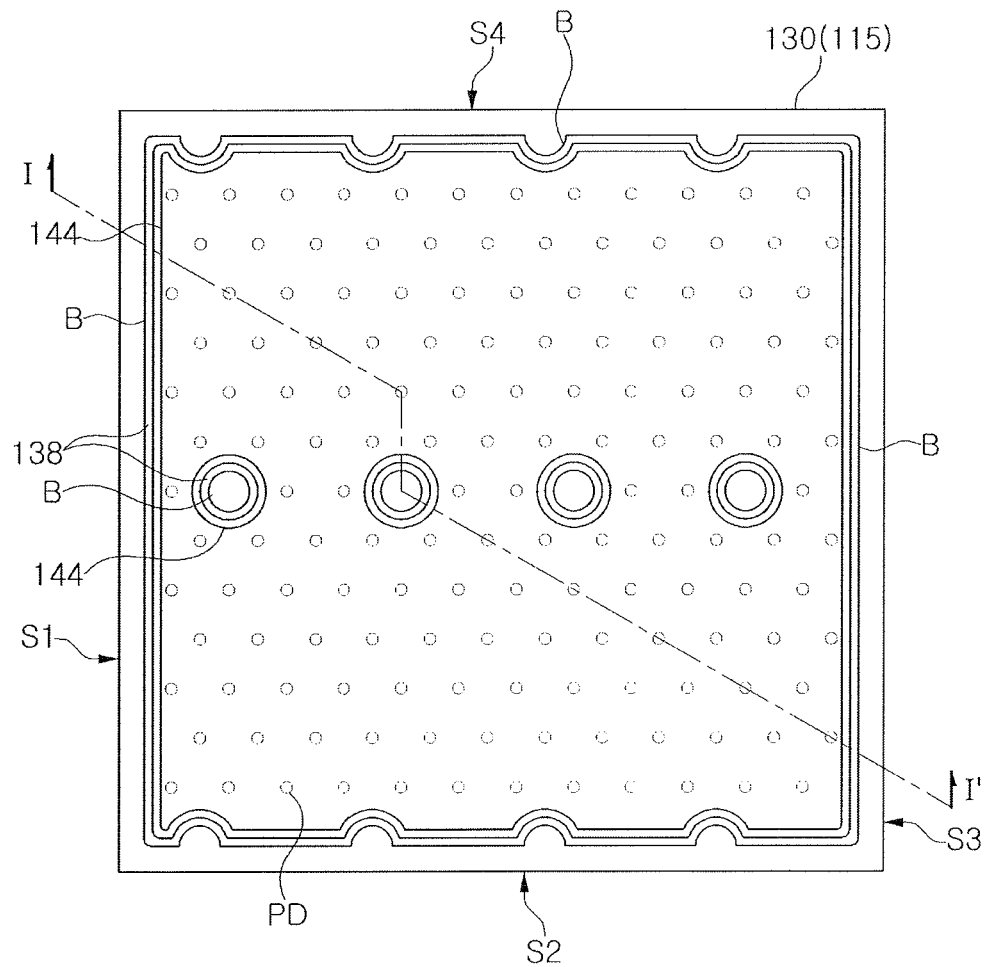
Figure 16:
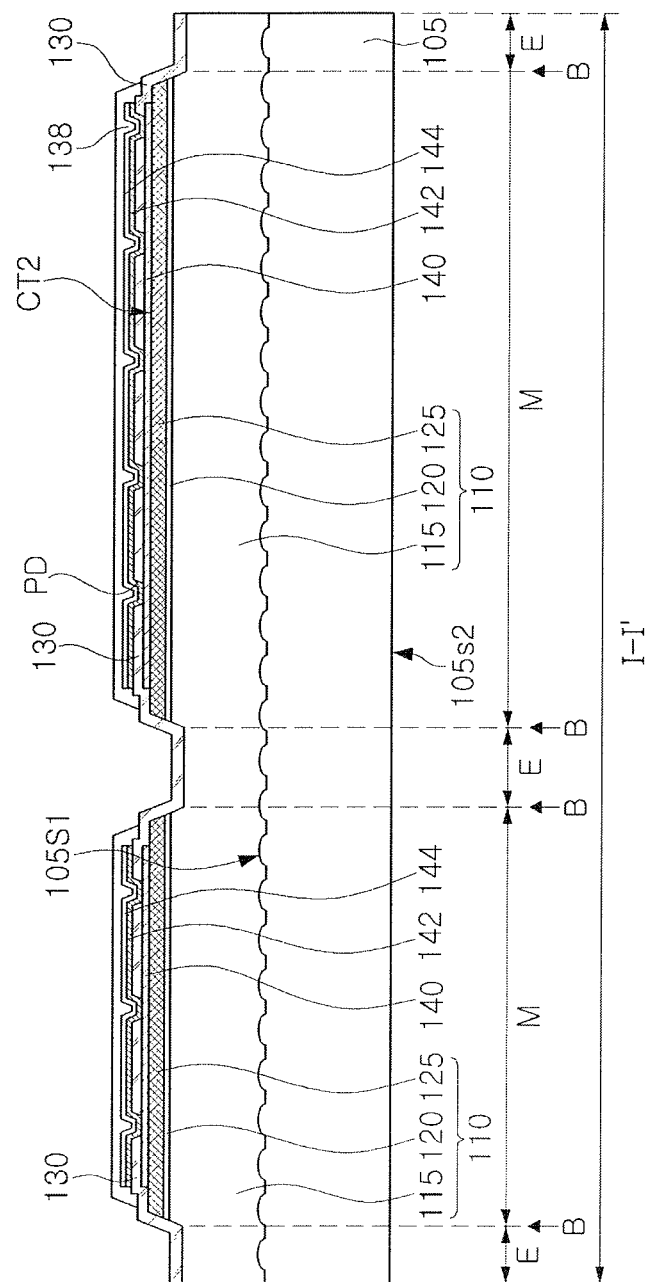

Referring to FIGS. 15 and 16, the transparent protective layer 138 may be formed on the reflective electrode layer 144. The transparent protective layer 138 may cover an upper surface and a side surface of the reflective electrode layer 144, and a side surface of the bonding electrode layer 142. The transparent protective layer 138 may cover a portion of the first insulating layer 130 adjacent to the reflective electrode layer 144. For example, the transparent protective layer 138 may be formed by forming a photoresist pattern exposing a region in which the transparent protective layer 138 is to be formed and then by performing a physical deposition process such as sputtering or the like.

Figure 17:
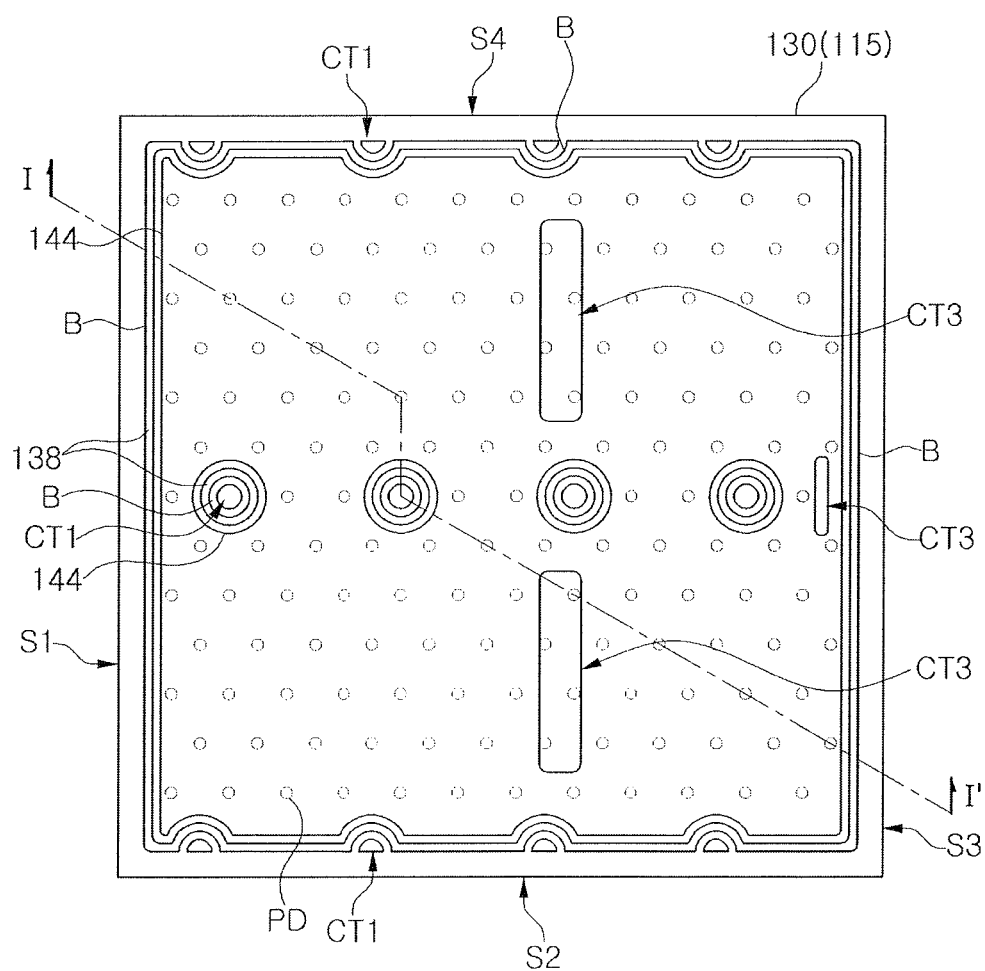
Figure 18:
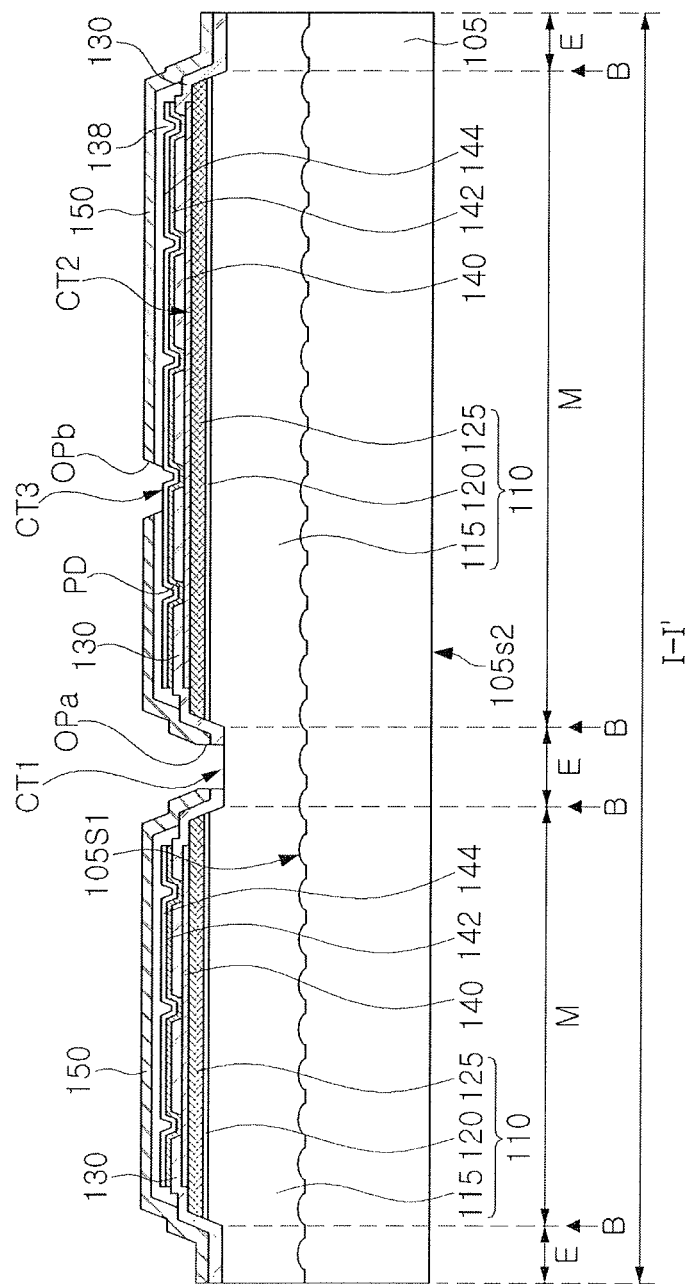

Referring to FIGS. 17 and 18, the second insulating layer 150 may be formed on the first insulating layer 130 and the transparent protective layer 138. The first opening OPa may be formed to penetrate through the first insulating layer 130 and the second insulating layer 150 and to expose a portion of the first conductivity-type semiconductor layer 115 of the recessed region E. The second opening OPb may be formed to penetrate through the transparent protective layer 138 and the second insulating layer 150 and to expose a portion of the reflective electrode layer 144 of the mesa region M. A surface of the first conductivity-type semiconductor layer 115 exposed by the first opening OPa may be referred to as the first contact region CT1, and a surface of the reflective electrode layer 144 exposed by the second opening OPb may be referred to as the third contact region CT3.

Figure 19:
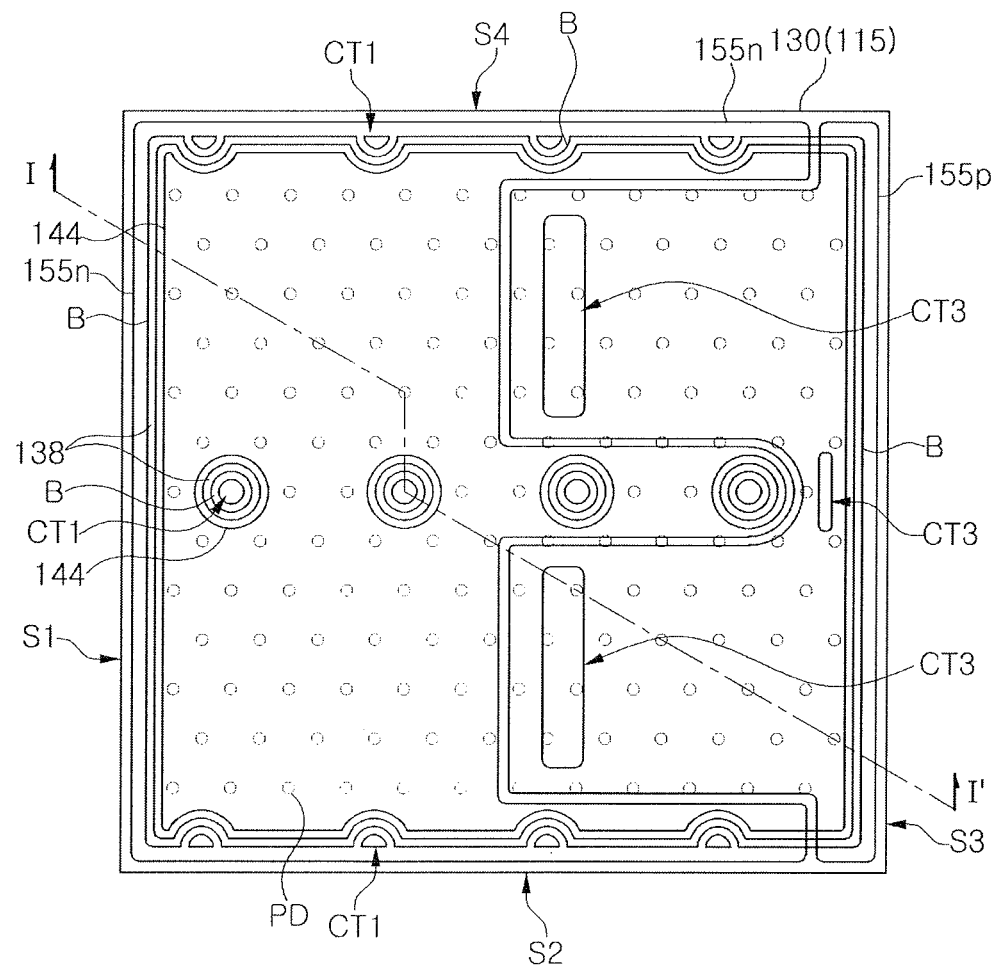
Figure 20:
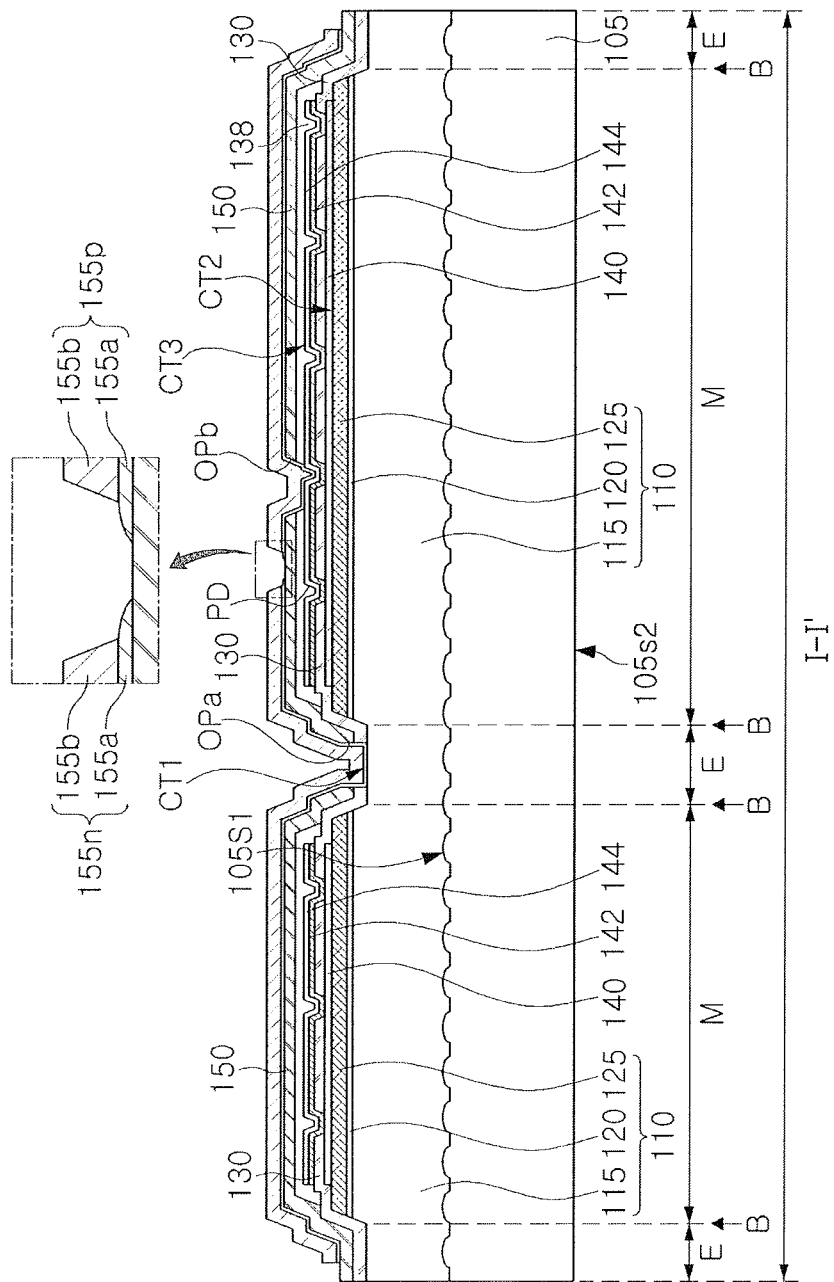

Referring to FIGS. 19 and 20, the first connection electrode 155n and the second connection electrode 155p may be formed on the substrate 105 including the second insulating layer 150. The first connection electrode 155n and the second connection electrode 155p may be formed by forming a negative photoresist pattern using a photolithography process and then depositing and lifting off a conductive material layer. The first connection electrode 155n and the second connection electrode 155p are formed by the same process, and may thus be formed of the same material. The first connection electrode 155n and the second connection electrode 155p may have the same thickness.

In the example embodiment, the first connection electrode 155n and the second connection electrode 155p may be implemented, by performing different deposition processes with respect to first and second electrode layers 155a and 155b, using a negative photoresist pattern having an undercut (FIGS. 2A to 2C). For example, the first electrode layer 155a may be formed using a sputtering process providing relatively high radial and angular uniformity, and the second electrode layer 155b may be formed using electron-beam evaporation.

Each of the first connection electrode 155n and the second connection electrode 155p may include the first electrode layer 155a including the edge region E1 and the internal region E2 surrounded by the edge region E1, and the second electrode layer 155b disposed in the internal region E2 of the first electrode layer 155a. The first electrode layer 155a may be formed to be wider than the second electrode layer 155b, and may protrude outwardly of the second electrode layer 155b to have a tail shape. An inclination angle of a tail portion in a cross-section thereof in a thickness direction may be 30 degrees or less.

The first electrode layer 155a and the second electrode layer 155b employed in the example embodiment may be functionally classified as a reflective layer and a current spreading layer, respectively. For example, the first electrode layer 155a may include at least one of Ag, Cr, Ni, Ti, Al, Rh, Ru, Pd, Au, Cu and combinations thereof, e.g., at least one of Ag and Al. In addition, the second electrode layer 155b may include at least one of Au and Cu.

Since the area of the first electrode layer 155a used as the reflective layer increases, light extraction efficiency may be improved, and an amount of light re-reflected from a package and then re-absorbed by a device may be reduced, thereby significantly improving luminous flux characteristics. In addition, adhesive properties of the first electrode layer 155a and the second insulating layer 150 that is an underlayer film, may be improved.

The first connection electrode 155n may be electrically connected to the first contact region CT1 of the first conductivity-type semiconductor layer 115. The second connection electrode 155p may be electrically connected to the third contact region CT3 of the reflective electrode layer 144.

Further, referring to FIGS. 3 and 4, the third insulating layer 160 including the third opening 16a and the fourth opening 160b may be formed on the substrate 105 including the first connection electrode 155n and the second connection electrode 155p. The third opening 160a of the third insulating layer 160 may exposed a portion of the first connection electrode 155n, and the fourth opening 160b of the third insulating layer 160 may exposed a portion of the second connection electrode 155p. A portion of the first connection electrode 155n exposed by the third opening 160a of the third insulating layer 160 may be referred to as a fourth contact region CT4, and a portion of the second connection electrode 155p exposed by the fourth opening 160b may be referred to as a fifth contact region CT5.

First and second electrode pads 165n and 165p may be formed on the substrate 105 including the third insulating layer 160. The first electrode pad 165n may be formed on the fourth contact region CT4 of the first connection electrode 155n, and the second electrode pad 165p may be formed on the fifth contact region CT5 of the second connection electrode 155p. The first and second electrode pads 165n and 165p may be under bump metal (UBM) pads. In an example, the number and arrangement of the first and second electrode pads 165n and 165p may be variously modified.

First and second solder columns 170n and 170p may be formed on the substrate 105 including the first and second electrode pads 165n and 165p. The first solder column 170n may be formed on the first electrode pad 165n, and the second solder column 170p may be formed on the second electrode pad 165p. A molding portion 172 may be formed to cover side surfaces of the first and second solder columns 170n and 170p.

Figure 21:
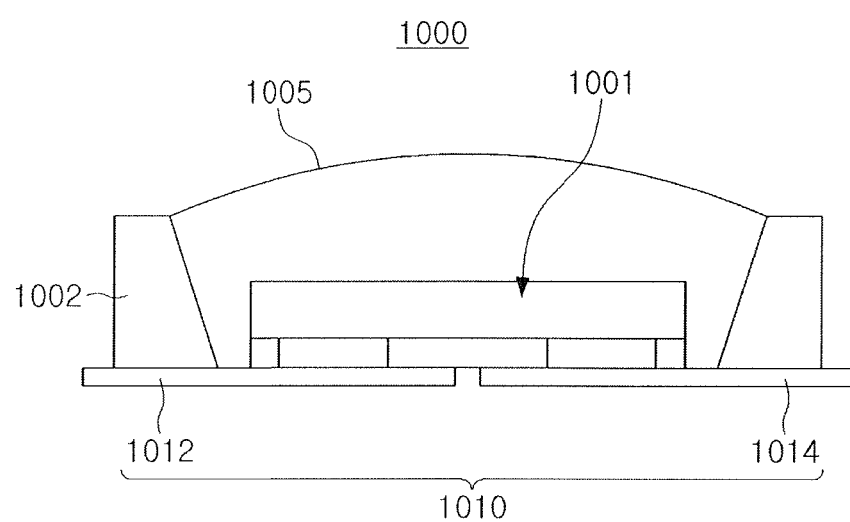
FIG. 21 illustrates a schematic cross-sectional view of a semiconductor light emitting device according to an example embodiment applied to a package.

The semiconductor light emitting device 10 as described above may be commercialized as a package. Hereinafter, an example in which the semiconductor light emitting device 10 as described above is applied to a package will be described with reference to FIG. 21. FIG. 21 is a schematic cross-sectional view illustrating an example in which a semiconductor light emitting device according to an example embodiment is applied to a package.

With reference to FIG. 21, a semiconductor light emitting device package 1000 may include a semiconductor light emitting device 1001, a package body 1002, one pair of lead frames 1010, and an encapsulation portion 1005. In this case, the semiconductor light emitting device 1001 may be the semiconductor light emitting device 10 of FIGS. 1 and 2, of which the description will be omitted.

The semiconductor light emitting device 1001 may be mounted on the lead frame 1010, and may be electrically connected to the lead frame 1010. One pair of lead frames 1010 may include a first lead frame 1012 and a second lead frame 1014. The semiconductor light emitting device 1001 may be connected to the first lead frame 1012 and the second lead frame 1014 by the first and second solder columns 170*n* and 170*p* of FIG. 2.

The package body 1002 may include a reflective cup to improve light reflection efficiency and light extraction efficiency. In the reflective cup, the encapsulation portion 1005 formed of a light transmitting material may be formed to encapsulate the semiconductor light emitting device 1001. The encapsulation portion 1005 may include a wavelength converting material such as a phosphor, a quantum dot, or the like.

As set forth above, according to example embodiments, a semiconductor light emitting device having improved luminous flux and reliability may be provided. That is, according to embodiments, a semiconductor light emitting device may include a connection electrode having a first functional layer (a reflective layer) that is larger than a second functional layer (a current distribution layer) thereon, so light may be more efficiently reflected from the larger reflective layer (that extends beyond the second layer thereon) toward a substrate and re-reflected from a package, thereby reducing the amount of light entering a device.

Further, bonding properties to a lower insulating layer may be improved. By using the same photoresist mask during formation of the connection electrode, the first functional layer (e.g., an Al layer or an Ag layer) may be formed using a radioactive deposition process, e.g., sputtering, and the second functional layer may be formed using another deposition process, e.g., e-beam evaporation, through the same photoresist mask. In addition, a transparent electrode, e.g., ITO, may be spaced apart from an edge of a mesa region by about 2 μm or more. Thus, ODR reflectance may be improved without loss of an operating voltage, thereby improving luminous flux.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor light emitting device, comprising:
   a light emitting structure including a first conductivity-type semiconductor layer, an active layer, and a second conductivity-type semiconductor layer;
   a transparent electrode layer on the second conductivity-type semiconductor layer, the transparent electrode layer being spaced apart from an edge of the second conductivity-type semiconductor layer;
   a first insulating layer on the light emitting structure to cover the transparent electrode layer, the first insulating layer including a plurality of holes connected to the transparent electrode layer; and
   a reflective electrode layer on the first insulating layer and connected to the transparent electrode layer through the plurality of holes.

2. The semiconductor light emitting device as claimed in claim 1, further comprising:
   a second insulating layer on the first insulating layer to cover the reflective electrode layer, the second insulating layer including at least one opening connected to the reflective electrode layer; and
   a connection electrode on the second insulating layer and connected to the reflective electrode layer through the at, least one opening.

3. The semiconductor light emitting device as claimed in claim 2, wherein the connection electrode includes:
   a first electrode layer having an edge region and an internal region surrounded by the edge region, the edge region having a thickness less than a thickness of the internal region; and
   a second electrode layer on the internal region of the first electrode layer.

4. The semiconductor light emitting device as claimed in claim 3, wherein the edge region of the first electrode layer has a thickness reduced externally.

5. The semiconductor light emitting, device as claimed in claim 3, wherein the second electrode layer has a thickness greater than a thickness of the first electrode layer.

6. The semiconductor light emitting device as claimed in claim 3, wherein the first electrode layer includes at least one of silver (Ag), chromium (Cr), nickel (Ni), titanium (Ti), aluminum (Al), rhodium (Rh), ruthenium (Ru), palladium (Pd), gold (Au), copper (Cu), and combinations thereof.

7. The semiconductor light emitting device as claimed in claim 2, further comprising a transparent protective layer on the first insulating layer to cover the reflective electrode layer.

8. The semiconductor light emitting device as claimed in claim 7, wherein the transparent protective layer includes at least one of $SiO_2$, SiN, $TiO_2$, HfO and $MgF_2$.

9. The semiconductor emitting device as claimed in claim 7, wherein the transparent protective layer includes a transparent conductive material, and the connection electrode is electrically connected to the reflective electrode layer through the transparent protective layer.

10. The semiconductor light emitting device as claimed in claim 2, wherein at least one of the first insulating layer and the second insulating layer includes at least one of $SiO_2$, SiN, $TiO_2$, HfO, $TaO_2$ and $MgF_2$.

11. The semiconductor light emitting device as claimed in claim 1, wherein a distance between the transparent electrode layer and the edge of the second conductivity-type semiconductor layer is about 2 μm or more.

12. The semiconductor light emitting device as claimed in claim 1, wherein the transparent electrode layer includes at least one of indium tin oxide (ITO), zinc-doped indium tin oxide (ZITO), zinc indium oxide (ZIO), gallium indium oxide (GIO), zinc tin oxide (ZTO), fluorine-doped tin oxide (FTC)), aluminum-doped zinc oxide (AZO), gallium-doped zinc oxide (GZO), $In_4Sn_3O_{12}$, and $Zn_{(1-x)}Mg_xO$ (Zinc Magnesium Oxide, $0 \leq x \leq 1$).

13. The semiconductor light emitting device as claimed in claim 1, wherein the reflective electrode layer includes, at least one of Ag, Cr, Ni, Ti, Al, Rh, Ru, Pd, Au, Cu, and combinations thereof.

14. The semiconductor light emitting device as claimed in claim 1, wherein the first insulating layer has a distributed Bragg reflector (DBR) structure, the DBR structure including insulating films having different refractive indices that are alternately stacked.

15. The semiconductor light emitting device as claimed in claim 1, further wherein the first insulating layer and the reflective electrode layer have an omni directional reflector (ODR) structure.

16. The semiconductor light emitting device as claimed in claim 1, further comprising a bonding electrode layer between the first insulating layer and the reflective electrode layer.

17. A semiconductor light emitting device, comprising:
- a light emitting structure including a first conductivity-type semiconductor layer, an active layer, and a second conductivity-type semiconductor layer;
- a transparent electrode layer on the second conductivity-type semiconductor layer;
- a first insulating layer on the light emitting structure to cover the transparent electrode layer, the first insulating layer including a plurality of holes connected to the transparent electrode layer;
- a reflective electrode layer on the first insulating, layer and connected to the transparent electrode layer through the plurality of holes;
- a second insulating layer on the first insulating layer to cover the reflective electrode layer, the second insulating layer including at least one opening; and
- a connection electrode on the second insulating layer and connected to the reflective electrode layer through the at least one opening,
- wherein the connection electrode includes a first electrode layer having an edge region and an internal region surrounded by the edge region, and a second electrode layer on the internal region of the first electrode layer, the edge region having a thickness less than a thickness of the internal region.

18. The semiconductor light emitting device as claimed in claim 17, wherein the edge region of the first electrode layer has an inclination angle of 30 degrees or less when viewed as a cross-section in a thickness direction.

19. The semiconductor light emitting device as claimed in claim 17, further comprising:
- a third insulating layer on the second insulating layer and including an opening exposing a portion of the connection electrode; and
- a bonding electrode on the portion of the connection electrode.

* * * * *